(12) United States Patent  
Watanabe

(10) Patent No.: US 9,136,867 B2  
(45) Date of Patent: Sep. 15, 2015

(54) ΔΣ-MODULATOR AND ΔΣ-A/D CONVERTER

(75) Inventor: Hikaru Watanabe, Nagoya (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 14/384,427

(22) PCT Filed: Apr. 19, 2012

(86) PCT No.: PCT/JP2012/060619  
§ 371 (c)(1),  
(2), (4) Date: Sep. 11, 2014

(87) PCT Pub. No.: WO2013/157127  
PCT Pub. Date: Oct. 24, 2013

(65) Prior Publication Data  
US 2015/0102951 A1  Apr. 16, 2015

(51) Int. Cl.  
H03M 3/00  (2006.01)

(52) U.S. Cl.  
CPC .............. *H03M 3/422* (2013.01); *H03M 3/374* (2013.01); *H03M 3/458* (2013.01); *H03M 3/464* (2013.01); *H03M 3/39* (2013.01); *H03M 3/416* (2013.01); *H03M 3/424* (2013.01); *H03M 3/454* (2013.01)

(58) Field of Classification Search  
CPC ....... H03M 3/374; H03M 3/416; H03M 3/39; H03M 3/454; H03M 3/424; H03M 3/422; H03M 3/458; H03M 3/464  
USPC .......................................... 341/143, 155, 172  
See application file for complete search history.

(56) References Cited

U.S. PATENT DOCUMENTS

| | | | |
|---|---|---|---|
| 6,445,331 B1 * | 9/2002 | Stegers | 341/172 |
| 6,653,967 B2 * | 11/2003 | Hamashita | 341/172 |
| 7,564,389 B1 * | 7/2009 | Byrd et al. | 341/143 |
| 8,106,809 B2 * | 1/2012 | Groenewold | 341/172 |
| 2009/0021409 A1 | 1/2009 | Mathe et al. | |

FOREIGN PATENT DOCUMENTS

| | | |
|---|---|---|
| JP | 2006-191168 | 7/2006 |
| JP | 2009-260605 | 11/2009 |
| JP | 2010-534038 | 10/2010 |
| JP | 2011-101247 | 5/2011 |

OTHER PUBLICATIONS

Yousry, R. et al., "A Third-Order 9-Bit 10 MHz CMOS ΔΣ Modulator With One Active Stage," IEEE Transactions on Circuits and Systems, vol. 55, No. 9, Oct. 2008, pp. 2469-2482.

* cited by examiner

*Primary Examiner* — Khai M Nguyen  
(74) *Attorney, Agent, or Firm* — Finnegan, Henderson, Farabow, Garrett & Dunner, LLP

(57) ABSTRACT

The present invention relates to a delta-sigma-modulator and a delta-sigma-A/D converter. By speeding up the settling time constant of an integrator at the last stage with a simple configuration, the sampling frequency is sped up in the delta-sigma-modulator as a whole. Specifically, in the delta-sigma-modulator including multiple integrators connected in cascade, the integrator positioned at the last stage is a passive integrator not using an amplifier circuit, and one or more integrators positioned at stages preceding the last stage by one or more stages are active SC integrators using amplifier circuits and switched capacitor circuits, respectively. Also, each of the integrators performs integral calculation by alternately repeating a first operation phase to charge a sampling capacitor by sampling an input signal, and a second operation phase to perform a summing integration by transferring an electric charge charged in the sampling capacitor to an integration capacitor.

11 Claims, 17 Drawing Sheets

ΔΣ-MODULATOR AND ΔΣ-A/D CONVERTER

CROSS-REFERENCE TO RELATED APPLICATIONS

This application is a national phase application of International Application No. PCT/JP2012/060619, filed Apr. 19, 2012, the content of which is incorporated herein by reference.

TECHNICAL FIELD

The present invention relates to a ΔΣ-modulator and a ΔΣ-A/D converter, especially, a ΔΣ-modulator having multiple integrators connected in cascade and a ΔΣ-A/D converter using the ΔΣ-modulator.

BACKGROUND ART

Conventionally, ΔΣ-A/D converters have been known as high-resolution A/D conversion methods (see, for example, Patent Document 1). A ΔΣ-A/D converter includes a ΔΣ-modulator provided at a preceding stage and a digital filter provided at a following stage. The ΔΣ-modulator converts an analog input signal by quantizing the signal with a comparatively coarse number of bits such as one bit or several bits, and outputs the quantized output value (digital signal sequence). In addition, the digital filter removes a quantization error difference from the digital signal sequence, which is the output signal from the ΔΣ-modulator, and performs final digital output.

The ΔΣ-modulator includes a difference signal generator to generate a difference signal between the analog input signal and a feedback signal; an integrator to amplify and to output the difference signal; a quantizer to quantize the output signal from the integrator, by comparing the output signal with a predetermined threshold value; and a D/A converter to apply digital-analog conversion to the output signal from the quantizer to generate the feedback signal. In the ΔΣ-modulator described in Patent Document 1, the integrator includes multiple integrators connected in cascade. Each of the integrators is an active SC integrator using an operational amplifier and a switched capacitor circuit, and includes a sampling capacitor to sample the input signal, and an integration capacitor to execute summing integration with transferred electric charge that has been charged in the sampling capacitor. In each of the integrators, sampling by the sampling capacitor (sampling phase) and integration by the integration capacitor (integration phase) are performed alternately and repeatedly. With such operations, summing integration is performed over differences between the analog input signal and the quantized output at the integrator.

Also, for example, if two stages of integrators are connected in cascade, during an integration phase of the first-stage integrator, the input terminal of the operational amplifier is connected with the first-stage sampling capacitor, whereas the output terminal of the operational amplifier is disconnected from the second-stage sampling capacitor. Also, during a sampling phase of the second-stage integrator, the input terminal of the first-stage operational amplifier is disconnected from the first-stage sampling capacitor, whereas the output terminal of the first-stage operational amplifier is connected with the second-stage sampling capacitor. Configured as such, assuming that the first-stage sampling capacitor and the second-stage sampling capacitor are alternately connected with the operational amplifier of the first-stage integrator, and also assuming that both sampling capacitors are not simultaneously connected with the integrator, then, the drive capability of the operational amplifier is relaxed because the settling time constant of the operational amplifier during an integral operation of the operational amplifier is equalized with the settling time constant in a sampling operation at the next stage.

RELATED-ART DOCUMENTS

Patent Documents

[Patent Document 1]
 Japanese Laid-open Patent Publication No. 2009-260605, FIG. 6

SUMMARY OF THE INVENTION

Problem to be Solved by Invention

Incidentally, as described above, the settling time constant $\tau$ of an active SC integrator that uses a switched capacitor circuit and an operational amplifier is determined depending on the unity gain frequency fu of the feedback loop of the operational amplifier, which is given by the next formula (1).

$$\tau = 1/(2\pi \cdot fu) \quad (1)$$

To realize high speed operation by making the settling time constant $\tau$ of the active SC integrator smaller, the unity gain frequency fu needs to be set high, although if the unity gain frequency fu is too high, the feedback system becomes unstable due to a phase delay of the operational amplifier, which makes a settling waveform overshoot. If the unity gain frequency fu goes even higher, the circuit exhibits abnormal oscillation, and the circuit operation of the integrator is not performed normally, which may adversely affect stability of other circuits on the same chip. In this regard, the unity gain frequency fu has an upper limit value fu_max that is determined depending on the phase margin of an operational amplifier, and hence, the settling time constant $\tau$ has a shortest limit value (least limit value) $\tau$_min ($=1/(2\pi \cdot fu\_max)$). To realize high speed operation of the active SC integrator while avoiding an overshoot of a settling waveform, the unity gain frequency fu of the feedback loop of the operational amplifier needs to be limited less than or equal to the above upper limit value fu_max, both during the sampling phase and during the integration phase.

In the following, quantitative examination will be made for an active SC integrator to achieve high speed operation up to the stability limit that is imposed by the phase delay of the operational amplifier. The operational amplifier here is assumed to be a voltage-input-current-output OTA (Operational Transconductance Amplifier) whose input voltage Vi and output current Io have a relationship given by the next formula (2) using transconductance Gm. In this case, the unity gain frequency fu of the feedback loop of the operational amplifier is given in general by the next formula (3) where $\beta$ and CLeff represent the feedback ratio of the feedback and the effective load capacitance of the operational amplifier, respectively.

$$Io = Gm \cdot Vi \quad (2)$$

$$Fu = 1/(2\pi \cdot \tau) = (1/2\pi) \cdot (Gm \cdot \beta)/CLeff \quad (3)$$

where the feedback ratio $\beta$ and the effective load capacitance CLeff during the sampling phase and the integration phase are represented by the next formulas (4-1), (4-2), (5-1), and (5-2), respectively, where Cs1 represents the capacitance of the sampling capacitor of the first-stage integrator; Cf1 represents the capacitance of the integration capacitor of the first-stage integrator; Cs2 represents the capacitance of the sampling capacitor of the second-stage integrator; Ci1 represents the input parasitic capacitance of the operational amplifier of the first-stage integrator; and Co1 represents the output parasitic capacitance of the operational amplifier of the first-stage integrator. Note that on-resistances and parasitic capacitances of analog switches in the integrators are neglected for the sake of simplicity.

$$\beta(s) = Cf1/(Ci1+Cf1) \quad (4-1)$$

$$CLeff(s) = Co1+Cs2+Cf1 \cdot (1-\beta) = Co1+Cs2+Cf1 \cdot Ci1/(Ci1+Cf1) \quad (4-2)$$

$$\beta(i) = Cf1/(Cs1+Ci1+Cf1) \quad (5-1)$$

$$CLeff(i) = Co1+Cf1 \cdot (1-\beta) = Co1+Cf1 \cdot (Cs1+Ci1)/(Cs1+Ci1+Cf1) \quad (5-2)$$

During the sampling phase, the input terminal of the operational amplifier is not connected with the sampling capacitor, and hence, the feedback ratio β becomes great (if Ci1<<Cf1 is satisfied, β≈1), and the increased amount of the feedback ratio β tends to make the effective load capacitance CLeff smaller. However, the sampling capacitor at the next stage is connected with the output terminal of the operational amplifier as a load capacitance, with which the effective load capacitance CLeff actually tends to increase. Also, during the integration phase, the input terminal of the operational amplifier is connected with the sampling capacitor, and hence, the feedback ratio β becomes small, and the decreased amount of the feedback ratio β tends to make the effective load capacitance CLeff greater. However, the sampling capacitor at the next stage is disconnected from the output terminal of the operational amplifier, with which the effective load capacitance CLeff actually tends to decrease.

Therefore, by setting the circuit constants, the unity gain frequencies fu of the sampling phase and the integration phase can be designed to take substantially the same value with each other, and by setting the transconductance Gm so that these unity gain frequencies fu take the upper limit fu_max, which is determined by the phase margin of the operational amplifier, it is possible to have the first-stage active SC integrator perform a settling operation at the highest speed. In this regard, focusing on one of the active SC integrators, if the integrator has a structure that enables the output side of the integrator to be connected with a sampling capacitor at the next stage, by alternately connecting its own sampling capacitor (Cs1) and the sampling capacitor (Cs2) at the next stage with the operational amplifier, the unity gain frequencies fu of the feedback loops of the respective operational amplifiers can be equalized while maximizing them during the sampling phase and the integration phase.

However, in a ΔΣ-modulator in which multiple integrators are connected in cascade, the integrator at the last stage does not have a sampling capacitor at the next stage. Therefore, if the integrator at the last stage is an active SC integrator, to sufficiently secure the phase margin of the operational amplifier during the sampling phase in the integrator at the last stage, the settling speed during the integration phase needs to be set low. In general, a ΔΣ-modulator synchronizes all integrators with the same clock for operation. Therefore, as described above, if the integrator at the last stage is an active SC integrator, the operation speed during the integration phase of the integrator at the last stage sets the limit of the overall operation speed of the ΔΣ-modulator, and consequently, it is difficult to speed up the sampling frequency of the ΔΣ-modulator as a whole.

Note that to make the settling speed during the integration phase of the integrator at the last stage high, one may come up with a method, for example, that has the integrator at the last stage additionally connected with pseudo load capacitance (capacitor or the like) and a switch for band restriction. However, such a configuration requires to provide additional elements such as a capacitor that occupies a large area in an integrated circuit, which increases the chip area, and brings about an inconvenient cost increase.

The present invention is made in view of the above, having an object to provide a ΔΣ-modulator and a ΔΣ-A/D converter in which the overall sampling frequency of the ΔΣ-modulator can be sped up by speeding up the settling time constant of the integrator at the last stage with a simple configuration.

Means to Solve the Problem

According to at least one embodiment of the present invention, a ΔΣ-modulator includes a plurality of integrators configured to be connected in cascade. One of the integrators positioned at the last stage is a passive integrator not using an amplifier circuit, and another one of the integrators positioned at a stage preceding the last stage by one or more stages is an active SC integrator using an amplifier circuit and a switched capacitor circuit.

Note that "a stage preceding the last stage by one or more stages" includes the stage preceding the last stage by one, namely, the stage immediately preceding the last stage.

Advantage of the Invention

According to at least one embodiment of the present invention, the overall sampling frequency of a ΔΣ-modulator can be sped up by speeding up the settling time constant of the integrator at the last stage with a simple configuration.

MODE FOR CARRYING OUT THE INVENTION

In the following, embodiments of ΔΣ-modulators and ΔΣ-A/D converters according to the present invention will be described with reference to the drawings.

First Embodiment

Figure 1:
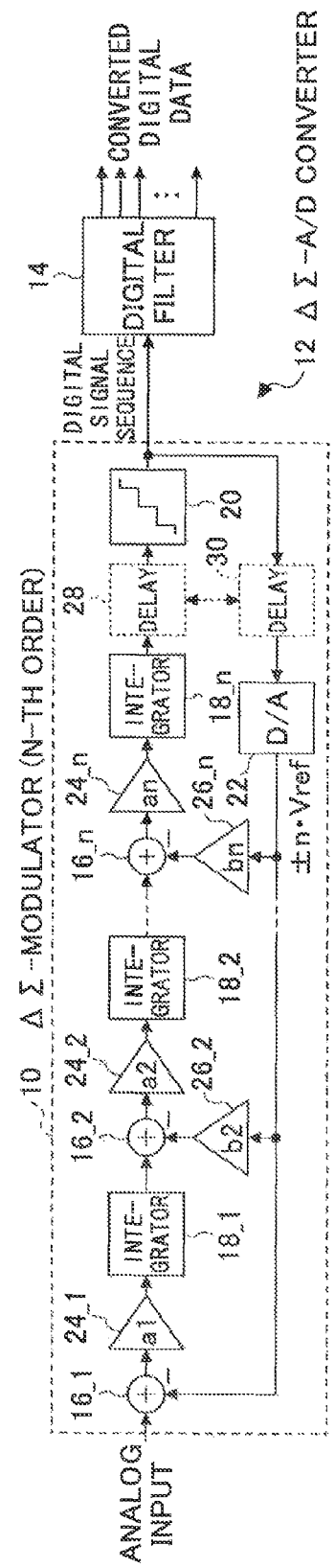
FIG. 1 is an overall configuration diagram of a ΔΣ-A/D converter that includes a ΔΣ-modulator according to a first embodiment of the present invention.

FIG. 1 illustrates an overall configuration diagram of a ΔΣ-A/D converter 12 that includes a ΔΣ-modulator 10 according to a first embodiment of the present invention. The ΔΣ-A/D converter 12 in the present embodiment is an analog-digital conversion device to convert an input analog input signal into digital data using the ΔΣ-modulator 10. The ΔΣ-A/D converter 12 is used for, for example, sensor detection, motor/solenoid current detection, load-short-circuit/open detection and the like used for in-vehicle electronics control.

As shown in FIG. 1, the ΔΣ-A/D converter 12 includes the ΔΣ-modulator 10 provided at the preceding stage and a digital filter 14 provided at the following stage. The ΔΣ-modulator 10 receives an analog input signal as input. The ΔΣ-modulator converts the input analog input signal into a digital signal sequence quantized by a predetermined number of bits, and outputs the digital signal sequence. The output of the ΔΣ-modulator 10 is connected with the input of the digital filter 14. The digital filter 14 removes a quantization error difference from the digital signal sequence supplied from the ΔΣ-modulator 10, and outputs the final digital data.

The ΔΣ-modulator 10 includes difference signal generators 16, integrators 18, a quantizer 20, and a D/A converter 22. The integrators 18 include multiple (n pieces where n≥2) integrators connected in cascade. In the following, among n pieces of the integrators connected in cascade, the integrator at the first stage is referred to as the "first integrator 18_1", the integrator at the second stage is referred to as the "second integrator 18_2", and the integrator at the n-th stage is referred to as the "n-th integrator 18_n". The ΔΣ-modulator 10 is an n-th order ΔΣ-modulator that has n pieces of the integrators 18_1-18_n connected in cascade where n is greater than or equal to two. The ΔΣ-modulator 10 synchronizes all integrators 18_1-18_n with the same clock for operation.

The difference signal generators 16 include multiple adder-subtracters. The number of adder-subtracters is n that is the same as the number of integrators 18 connected in cascade. In the following, the adder-subtracter at the first stage is referred to as the "first adder-subtracter 16_1", the adder-subtracter at the second stage is referred to as the "second adder-subtracter 16_2", and the adder-subtracter at the n-th stage is referred to as the "n-th adder-subtracter 16_n". The first adder-subtracter 16_1 receives the analog input signal as input from the outside, and also receives a feedback signal as input, which will be described later. The first adder-subtracter 16_1 generates a difference signal that represents a difference between the input analog input signal and the feedback signal, or specifically, subtracts the feedback signal from the analog input signal to generate the difference signal.

The output of the first adder-subtracter 16_1 is connected with the input of a multiplier 24_1. The multiplier 24_1 multiplies the difference signal from the first adder-subtracter 16_1 by a predetermined coefficient a1. The output of the multiplier 24_1 is connected with the input of the first integrator 18_1. The first integrator 18_1 integrates the signal from the multiplier 24_1. The output of the first integrator 18_1 is connected with the input of the second adder-subtracter 16_2. The second adder-subtracter 16_2 also receives the feedback signal (described later) as input via a multiplier 26_2. The multiplier 26_2 multiplies the feedback signal by a predetermined coefficient b2, and outputs the product to the second adder-subtracter 16_2. The second adder-subtracter 16_2 generates a difference signal representing a difference between the analog input signal from the first integrator 18_1 and the feedback signal from the multiplier 26_2, specifically, the difference signal that subtracts the feedback signal coming from the multiplier 26_2 from the analog input signal coming from the first integrator 18_1.

The output of the second adder-subtracter 16_2 is connected with the input of the multiplier 24_2. The multiplier 24_2 multiplies the difference signal from the second adder-subtracter 16_2 by a predetermined coefficient a2. The output of the multiplier 24_2 is connected with the input of the second integrator 18_2. The second integrator 18_2 integrates the signal from the multiplier 24_2. The output of the second integrator 18_2 is connected with the input of the third adder-subtracter 16_3. The third adder-subtracter 16_3 performs substantially the same process as the process of the second adder-subtracter 16_2 described above. And, the n-th adder-subtracter 16_n generates a difference signal representing a difference between the analog input signal from the (n−1)-th integrator 18_(n−1) and the feedback signal from the multiplier 26_n, specifically, the difference signal that subtracts the feedback signal coming from the multiplier 26_n from the analog input signal coming from the (n−1)-th integrator 18_(n−1).

And, the output of the n-th adder-subtracter 16_n is connected with the input of the multiplier 24_n. The multiplier 24_n multiplies the difference signal from the n-th adder-subtracter 16_n by a predetermined coefficient an. The output of the multiplier 24_n is connected with the input of the n-th integrator 18_n. The n-th integrator 18_n integrates the signal from the multiplier 24_n. The output of the n-th integrator 18_n is connected with the input of the quantizer 20 via a delay circuit 28. The delay circuit 28 delays the signal integrated at the n-th integrator 18_n for a predetermined time. The quantizer 20 quantizes the signal from the n-th integrator 18_*n* with a predetermined number of bits such as one bit or several bits, by comparing with a predetermined threshold value, and outputs a digital signal sequence as the output of the ΔΣ-modulator 10.

The output of the quantizer 20 is connected with the input of the digital filter 14 and the input of the D/A converter 22. Note that a delay circuit 30 may be provided between the output of the quantizer 20 and the input of the D/A converter 22. The delay circuit 30 is provided along with or instead of the delay circuit 28 described above. The digital filter 14 removes quantization error difference by filtering the digital signal sequence from the quantizer 20 with a moving-average-based filter process, and outputs the final digital data.

The D/A converter 22 converts the digital signal sequence from the quantizer 20 into an analog feedback signal. The output of the D/A converter 22 is connected with the input of the difference signal generators 16. Each of the difference signal generators 16 generates a difference signal that subtracts the feedback signal coming from the D/A converter 22 or the feedback signal coming from the D/A converter 22 amplified at the multiplier 26_2-26_*n*, from the analog input signal.

Figure 2:
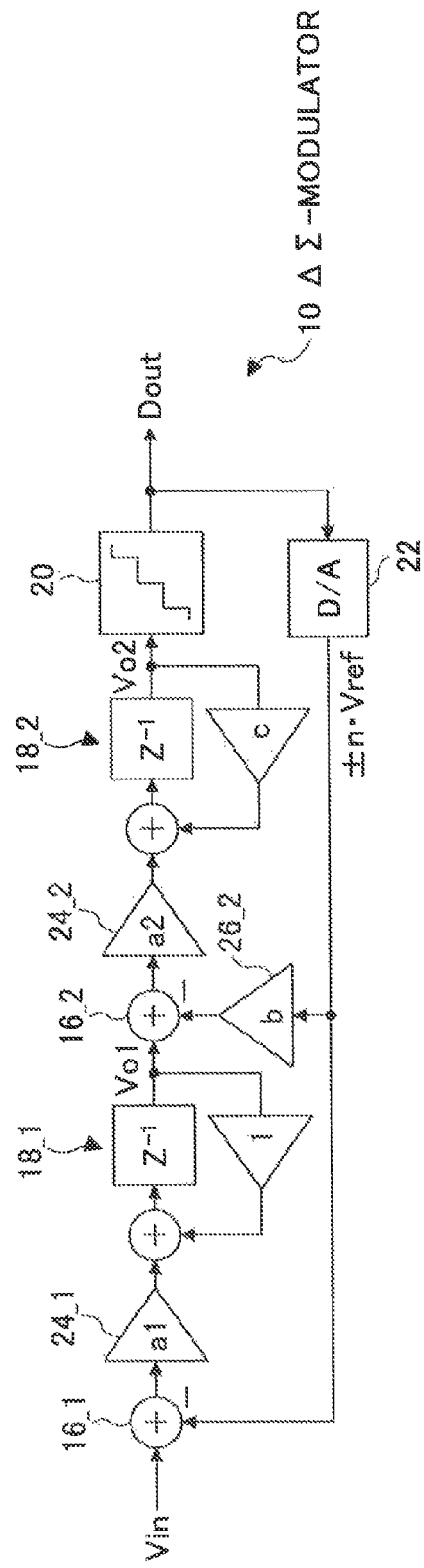
FIG. 2 is a block diagram of a ΔΣ-modulator according to the present embodiment.
Figure 3:
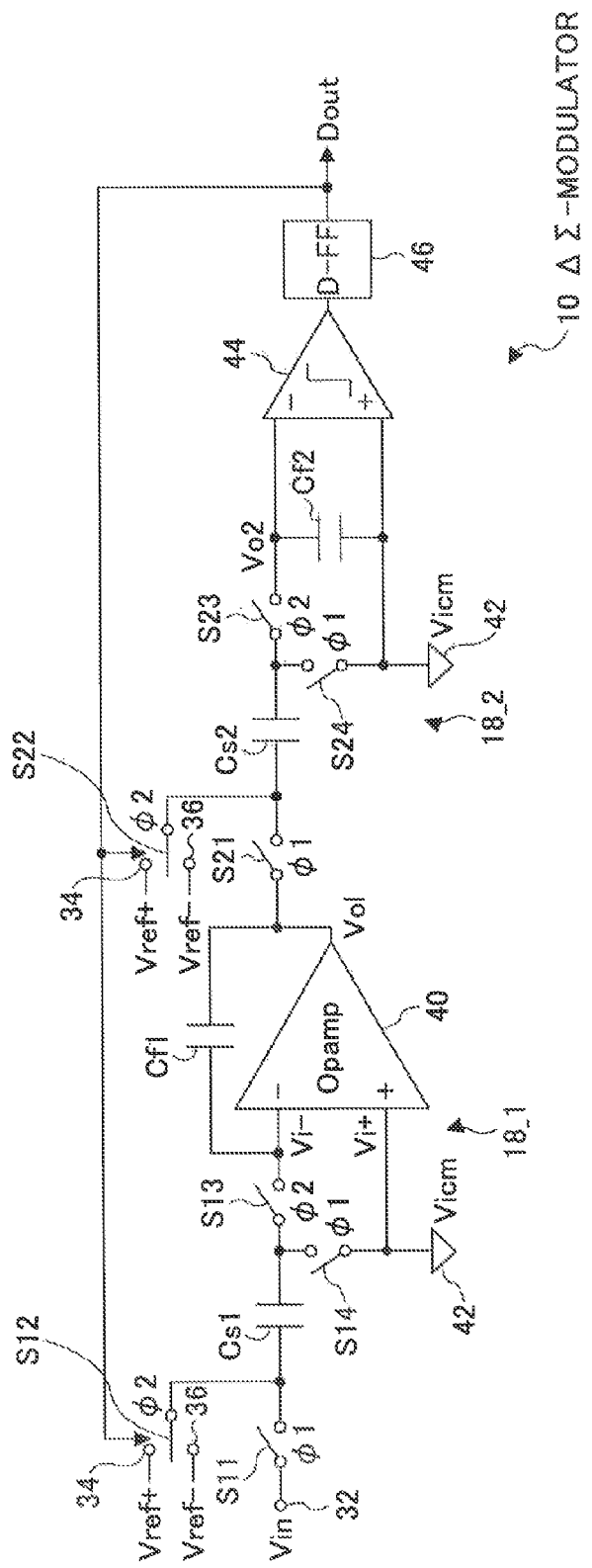
FIG. 3 is a circuit diagram of a ΔΣ-modulator according to the present embodiment.

FIG. 2 illustrates a block diagram of the ΔΣ-modulator 10 according to the present embodiment. Also, FIG. 3 illustrates a circuit diagram of the ΔΣ-modulator 10 according to the present embodiment. Also, in the following, it is assumed that n=2 is satisfied, and the ΔΣ-modulator 10 is a second-order ΔΣ-modulator having the integrators 18_1-18_2 connected in cascade in two stages.

The ΔΣ-modulator 10 is a ΔΣ-modulator with single end output. The ΔΣ-modulator 10 includes switched capacitors. Namely, the ΔΣ-modulator 10 includes sampling capacitors Cs1 and Cs2 that can sample input analog potentials for the integrators 18_1 and 18_2, respectively. The first sampling capacitor Cs1 is provided for the first integrator 18_1 at the first stage, and the second sampling capacitor Cs2 is provided for the second integrator 18_2 at the second stage.

The input side terminal of the first sampling capacitor Cs1 is connected with the input terminal 32 via a switch S11. The input terminal 32 receives an analog input potential Vin as input to which A/D conversion is applied in the ΔΣ-modulator 10. The switch S11 is a switch to make the input side terminal of the first sampling capacitor Cs1 conducted to or disconnected from the input terminal 32. Specifically, the switch S11 is turned off to disconnect when the analog input potential Vin input into the input terminal 32 should not be sampled, or it is turned on to conduct when the analog input potential Vin should be sampled.

When the switch S11 is in an on-state, the first sampling capacitor Cs1 can accumulate electric charge that is input via the switch S11 in accordance with the input analog input potential Vin, and samples the analog input potential Vin with the accumulated input electric charge.

The input side terminal of the first sampling capacitor Cs1 is also connected with the first reference terminal 34 and the second reference terminal 36 via the switch S12. The switch S12 is a switch to make the first reference terminal 34 conducted to or disconnected from the input side terminal of the first sampling capacitor Cs1, and is also a switch to make the second reference terminal 36 conducted to or disconnected from the input side terminal of the first sampling capacitor Cs1. The switch S12 makes the input side terminal of the first sampling capacitor Cs1 conducted to one of the first reference terminal 34 and the second reference terminal 36, or disconnected from both.

The first reference terminal 34 has the first reference potential Vref+ supplied, and the second reference terminal 36 has the second reference potential Vref− supplied. The first reference potential Vref+ is a positive power source potential, for example, 5 V. Also, the second reference potential Vref− is a negative power source potential, for example, 0 V. Both the first and second reference potentials Vref+ and Vref− operate as analog feedback signals output from the D/A converter 22.

When it is time to perform a summing integration by transferring electric charge accumulated in the first sampling capacitor Cs1, the switch S12 makes the first reference terminal 34 or the second reference terminal 36 conducted to the input side terminal of the first sampling capacitor Cs1, or when it is not time to perform the summing integration by transferring electric charge accumulated in the first sampling capacitor Cs1, it makes both the first and second reference terminals 34 and 36 disconnected from the input side terminal of the sampling capacitor Cs1. Note that the reference terminal 34 or 36 to be conducted to the input side terminal when transferring electric charge in the first sampling capacitor Cs1 is determined depending on an output potential Dout as the digital signal sequence of the ΔΣ-modulator 10.

When the switch S12 makes the first reference terminal 34 or the second reference terminal 36 conducted to the input side terminal of the first sampling capacitor Cs1, the first sampling capacitor Cs1 can transfer electric charge relative to the reference potential Vref+ or Vref− as a reference input through the switch S12.

The ΔΣ-modulator 10 includes an operational amplifier 40 provided for the first integrator 18_1. Namely, the first integrator 18_1 includes the operational amplifier 40. The operational amplifier 40 amplifies an input potential, and outputs the amplified potential as the output potential Vo1 of the first integrator 18_1. The operational amplifier 40 has sufficiently high gain, and has an ideal integrator characteristic that presents virtually no integrator leak within the output voltage range. The operational amplifier 40 is designed to have sufficiently low output impedance, and is hardly affected by its own integrator characteristic even if a load (capacitance and/or resistor) at the next stage is connected to its output as long as sufficient time passes since a start of settling.

The output side terminal of the first sampling capacitor Cs1 is connected with an inverted input terminal of the operational amplifier 40 via a switch S13. The switch S13 is a switch to make the output side terminal of the first sampling capacitor Cs1 conducted to or disconnected from the inverted input terminal of the operational amplifier 40. Specifically, the switch S13 is turned on when it is time to perform summing integration by transferring electric charge accumulated in the first sampling capacitor Cs1, or is turned off when it is not time to perform summing integration by transferring electric charge.

The output side terminal of the first sampling capacitor Cs1 is also connected with a third reference terminal 42 via a switch S14, and is also connected with a non-inverted input terminal of the operational amplifier 40. The third reference terminal 42 receives a predetermined input common mode potential Vicm as input. Therefore, the non-inverted input terminal of the operational amplifier 40 receives the input common mode potential Vicm as input. The input common mode potential Vicm is a voltage appropriate to make the operational amplifier 40 operate, for example, 0.8 V. The operational amplifier 40 outputs the potential Vo1 that is an amplified difference between the potential Vi− of the inverted input terminal and the potential Vi+(=Vicm) of the non-inverted input terminal.

The switch S14 is a switch to make the output side terminal of the first sampling capacitor Cs1 conducted to or disconnected from the third reference terminal 42. The switch S14 is turned off when it is not time to sample the first sampling capacitor Cs1, or turned on when it is time to sample the first sampling capacitor Cs1.

A capacitor Cf1 is connected between the inverted input terminal and output terminal of the operational amplifier 40. The capacitor Cf1 is a temporary storage capacitor to which electric charge accumulated in the first sampling capacitor Cs1 is transferred. In the following, the capacitor Cf1 is referred to as the "first integration capacitor Cf1". Note that the capacitance of the first integration capacitor Cf1 is set to a value greater than the capacitance of the first sampling capacitor Cs1. In the following, the capacitance of a capacitor may be represented by the numeric code attached to the capacitor when appropriate. The gain of the first integrator 18_1 is a1 described above, which is represented by Cs1/Cf1 (a1=Cs1/Cf1).

Also, the input side terminal of the second sampling capacitor Cs2 is connected with the output terminal of the operational amplifier 40 and the first integration capacitor Cf1 via a switch S21. The switch S21 is a switch to make the input side terminal of the second sampling capacitor Cs2 conducted to or disconnected from the output terminal of the operational amplifier 40, namely, the first integration capacitor Cf1. Specifically, the switch S21 is turned off when it is not time to sample the operational amplifier 40, namely, the output potential Vo1 of the first integrator 18_1, or turned on when it is time to sample the output potential Vo1.

When the switch S21 is in an on-state, the second sampling capacitor Cs2 can accumulate electric charge that is input via the switch S21 in accordance with the output potential Vo1 of the first integrator 18_1, and samples the output potential Vo1 of the first integrator 18_1 with the accumulated input electric charge.

The input side terminal of the second sampling capacitor Cs2 is also connected with the first reference terminal 34 and the second reference terminal 36 via a switch S22. The switch S22 is a switch to make the first reference terminal 34 conducted to or disconnected from the input side terminal of the second sampling capacitor Cs2, and is also a switch to make the second reference terminal 36 conducted to or disconnected from the input side terminal of the second sampling capacitor Cs2. The switch S22 makes the input side terminal of the second sampling capacitor Cs2 conducted to one of the first reference terminal 34 and the second reference terminal 36, or disconnected from both.

When it is time to perform summing integration by transferring electric charge accumulated in the second sampling capacitor Cs2, the switch S22 makes the first reference terminal 34 or the second reference terminal 36 conducted to the input side terminal of the second sampling capacitor Cs2, or when it is not time to perform summing integration by transferring electric charge accumulated in the second sampling capacitor Cs2, it makes both the first and second reference terminals 34 and 36 disconnected from the input side terminal of the sampling capacitor Cs2. Note that the reference terminal 34 or 36 to be conducted to the input side terminal when transferring electric charge in the second sampling capacitor Cs2 is determined depending on the output potential Dout as the digital signal sequence of the ΔΣ-modulator 10.

When the switch S22 makes the first reference terminal 34 or the second reference terminal 36 conducted to the input side terminal of the second sampling capacitor Cs2, the second sampling capacitor Cs2 can transfer electric charge relative to the reference potential Vref+ or Vref− as a reference input through the switch S22.

The ΔΣ-modulator 10 includes a comparator 44 as the quantizer 20. The comparator 44 outputs the digital signal sequence by comparing an input potential with a predetermined threshold value. The output side terminal of the second sampling capacitor Cs2 is connected with an inverted input terminal of the comparator 44 via a switch S23. The switch S23 is a switch to make the output side terminal of the second sampling capacitor Cs2 conducted to or disconnected from the inverted input terminal of the comparator 44. Specifically, the switch S13 is turned on when it is time to perform summing integration by transferring electric charge accumulated in the second sampling capacitor Cs2, or is turned off when it is not time to perform summing integration by transferring electric charge.

The output side terminal of the second sampling capacitor Cs2 is also connected with the third reference terminal 42 via a switch S14, and is also connected with a non-inverted input terminal of the comparator 44. The third reference terminal 42 receives the predetermined input common mode potential Vicm as input, and hence, the non-inverted input terminal of the comparator 44 receives the input common mode potential Vicm as input. The input common mode potential Vicm functions as a threshold value when the comparator 44 makes a comparison operation.

A capacitor Cf2 is connected between the inverted input terminal and non-inverted output terminal of the comparator 44. The capacitor Cf2 is a temporary storage capacitor to which electric charge accumulated in the second sampling capacitor Cs2 is transferred. In the following, the capacitor Cf2 is referred to as the "second integration capacitor Cf2". Note that the capacitance of the second integration capacitor Cf2 is set to a value greater than the capacitance of the second sampling capacitor Cs2. The gain of the second integrator 18_2 is a2 described above, which is represented by Cs2/Cf2 (a2=Cs2/Cf2).

The comparator 44 compares the output potential Vo2 of the second integrator 18_2 that appears at the output side terminal of the second sampling capacitor Cs2, with the input common mode potential Vicm as the threshold value, and outputs the digital signal sequence of one bit or several bits. The comparator 44 is connected with a D flip-flop (D-FF) 46. The D flip-flop 46, or the output of the D flip-flop 46, is used for selection at the switches S12 and S22.

Figure 4:
FIG. 4 is a schematic view illustrating that a sampling phase φ1 and an integration phase φ2 are performed at different timings in a ΔΣ-modulator according to the present embodiment.
Figure 5:
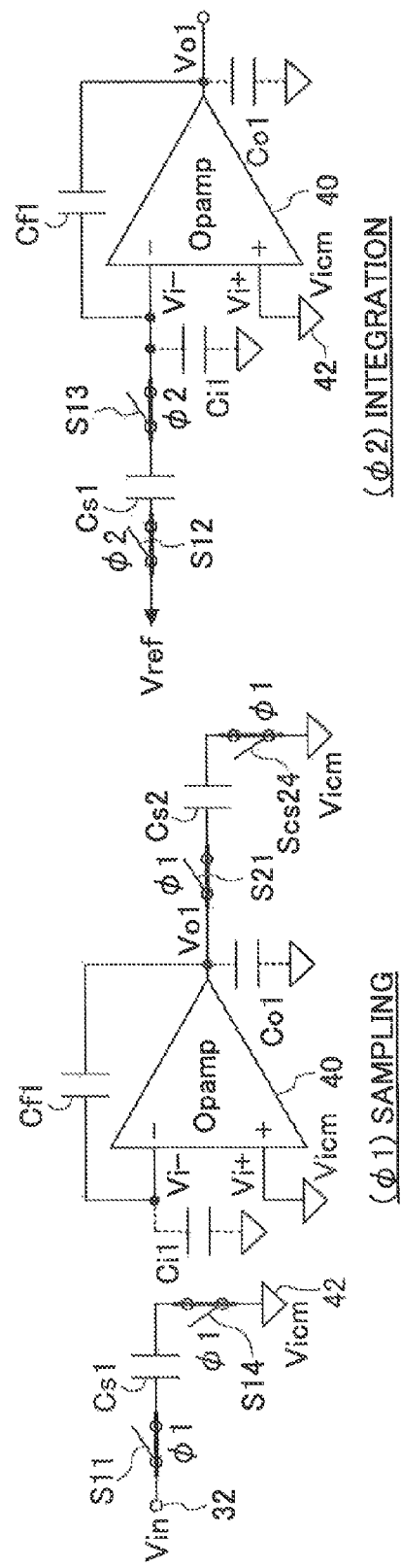
FIG. 5 is a schematic view illustrating a circuit operation during a sampling phase φ1 and a circuit operation during an integration phase φ2 in a ΔΣ-modulator according to the present embodiment.

FIG. 4 is a schematic view illustrating that a sampling phase φ1 and an integration phase φ2 are performed at different timings in the ΔΣ-modulator 10 according to the present embodiment. Also, FIG. 5 is a schematic view illustrating a circuit operation during the sampling phase φ1 and a circuit operation during the integration phase φ2 in the ΔΣ-modulator 10 according to the present embodiment. Note that an input parasitic capacitance Ci1 and an output parasitic capacitance Co1 of the operational amplifier 40 are shown in FIG. 5.

In the ΔΣ-modulator 10 in the present embodiment, when the analog input signal Vin is sampled at the first integrator 18_1 (sampling phase φ1), both the switches S11 and S14 are turned on, and both the switches S12 and S13 are turned off. Once both the switches S11 and S14 are turned on, and both the switches S12 and S13 are turned off, a potential difference (input voltage) between the analog input potential Vin input into the input terminal 32 and the input common mode potential Vicm is applied to both terminals of the first sampling capacitor Cs1, which makes electric charge (input electric charge) accumulate that corresponds the analog input potential Vin relative to the input common mode potential Vicm as a reference. Thus, in the sampling phase φ1, sampling of the analog input potential Vin is performed at the first sampling capacitor Cs1 using the input common mode potential Vicm as the reference.

When the sampling of the analog input potential Vin is completed at the first sampling capacitor Cs1 to have the capacitor Cs1 accumulate the input electric charge in accordance with the analog input potential Vin, next, the electric charge accumulated in the first sampling capacitor Cs1 is transferred to the first integration capacitor Cf1 to perform summing integration. When performing the summing integration (during the integration phase φ2), both the switches S11 and S14 are turned off, both the switches S12 and S13 are turned on, and the switch S21 is turned off. Note that the sampling during the sampling phase φ1 and the integration during the integration phase φ2 are performed at timings different from each other, and the sampling phase φ1 and the integration phase φ2 are alternately repeated without temporally overlapped.

Once both the switches S11 and S14 are turned off, both the switches S12 and S13 are turned on, and the switch S21 is turned off, the input side terminal of the first sampling capacitor Cs1 has the reference potential Vref+ or Vref− applied, and the first sampling capacitor Cs1 is connected with the first integration capacitor Cf1 disconnected from the second integrator 18_2.

In this case, the electric charge accumulated in the first sampling capacitor Cs1 that corresponds to the analog input potential Vin is transferred to the first integration capacitor Cf1 using the reference potential Vref+ or Vref− as the reference. Therefore, during the integration phase φ2, a voltage is generated between both terminals of the first integration capacitor Cf1 that corresponds to the capacitance of the first sampling capacitor Cs1 and the first integration capacitor Cf1, and the analog input potential Vin. Therefore, an analog potential appears at the output terminal of the operational amplifier 40 as the output potential Vo1 of the first integrator 18_1, which corresponds to the capacitance of the first sampling capacitor Cs1 and the first integration capacitor Cf1, and the analog input potential Vin, relative to the input common mode potential Vicm as the reference.

Also, during the next sampling phase φ1, sampling at the first integrator 18_1 is performed by the same method as above, and further, sampling of the output potential Vo1 of the first integrator 18_1 is performed at the second integrator 18_2. Namely, the integrators 18_1 and 18_2 of the ΔΣ-modulator 10 perform sampling at the same time, and perform sampling of the analog input potential Vin and the output potential Vo1 of the first integrator 18_1, respectively, during the same sampling phase φ1.

Specifically, during the sampling phase φ1 both the switches S21 and S24 are turned on and both the switches S22 and S23 are turned off in the second integrator 18_2. Once both the switches S21 and S24 are turned on and both the switches S22 and S23 are turned off in the second integrator 18_2, a potential difference (input voltage) between the output potential Vo1 of the first integrator 18_1 and the input common mode potential Vicm is applied to both terminals of the second sampling capacitor Cs2, which makes electric charge (input electric charge) accumulate that corresponds to the output potential Vo1 of the first integrator 18_1 relative to the input common mode potential Vicm as a reference. Thus, in the sampling phase φ1, sampling of the output potential Vo1 of the first integrator 18_1 is performed at the second sampling capacitor Cs2 using the input common mode potential Vicm as the reference.

Also, during the next integration phase φ2, integration by electric charge transferred from the first sampling capacitor Cs1 to the first integration capacitor Cf1 at the first integrator 18_1 is performed by the same method as above, and further, integration is also performed by electric charge transferred from the second sampling capacitor Cs2 to the second integration capacitor Cf2 at the second integrator 18_2. Namely, the integrators 18_1 and 18_2 of the ΔΣ-modulator 10 perform integration at the same time, and perform integration by electric charge transferred from the sampling capacitor Cs to the integration capacitor Cf during the same integration phase φ2.

Specifically, during the integration phase φ2, both the switches S21 and S24 are turned off and both the switches S22 and S23 are turned on in the second integrator 18_2. Once both the switches S21 and S24 are turned off and both the switches S22 and S23 are turned on in the second integrator 18_2, the input side terminal of the second sampling capacitor Cs2 has the reference potential Vref+ or Vref− applies, and the second sampling capacitor Cs2 is connected with the second integration capacitor Cf2.

In this case, the electric charge accumulated in the second sampling capacitor Cs2 that corresponds to the output potential Vo1 of the first integrator 18_1 is transferred to the second integration capacitor Cf2 using the reference potential Vref+ or Vref− as the reference. When the transfer is performed, the voltage generated between both terminals of the second integration capacitor Cf2 takes a value that corresponds to the capacitance of the second sampling capacitor Cs2 and the second integration capacitor Cf2, and the output potential Vo1 of the first integrator 18_1. Therefore, during the integration phase φ2, using the input common mode potential Vicm as the reference, an analog potential that corresponds to the capacitance of the second sampling capacitor Cs2 and the second integration capacitor Cf2, and the output potential Vo1 of the first integrator 18_1 is input into the inverted input terminal of the comparator 44 as the output potential Vo2 of the second integrator 18_2.

The comparator 44 outputs a result obtained by comparing the output potential Vo2 of the second integrator 18_2 applied to the inverted input terminal, with the input common mode potential Vicm as the digital signal sequence, and then, the D flip-flop 46 outputs a digital signal sequence obtained by delaying the digital signal sequence output from the comparator 44 as the output potential Dout of the ΔΣ-modulator 10. Thus, the ΔΣ-modulator 10 converts the analog input potential Vin into the digital signal sequence.

The ΔΣ-modulator 10 in the present embodiment is an n-th order ΔΣ-modulator that has n pieces of the integrators 18_1-18_n connected in cascade where n is greater than or equal to two (note that it is a second-order ΔΣ-modulator in FIG. 2 and FIG. 3 where n=2 is satisfied). Among n pieces of the integrators 18_1-18_n in the ΔΣ-modulator 10, the n-th integrator 18_n positioned at the last stage is a passive integrator that does not use an amplifier circuit such as an operational amplifier, and the (n−1)-th integrator 18_(n−1) position at the stage preceding the last stage is an active SC integrator that uses an amplifier circuit using an operational amplifier 40 and a switched capacitor circuit using switches and capacitors.

Note that the first integrator 18_1 to the (n−2)-th the integrator 18_(n−2) may be active SC integrators, respectively, or they may be any types of integrators as long as sampling capacitors are provided at the next stages. Note that the second-order ΔΣ-modulator is taken as an example in the following where n=2 is satisfied, and the first integrator 18_1 is referred to as the "active SC integrator 18_1", the second integrator 18_2 is referred to as the "passive integrator 18_2".

In the present embodiment, the active SC integrator 18_1 positioned at the stage preceding the last stage is alternately connected with either of the first sampling capacitor Cs1 of its own or the second sampling capacitor Cs2 at the next stage (the passive integrator 18_2). Specifically, during the integration phase φ2 when integration is performed, the active SC integrator 18_1 has its input connected with the first sampling capacitor Cs1, and has its output disconnected from the second sampling capacitor Cs2. Alternately, during the sampling phase φ1 when sampling is performed, the active SC integrator 18_1 has its input disconnected from the first sampling capacitor Cs1, and has its output connected with the second sampling capacitor Cs2.

Thus, in the present embodiment, the active SC integrator 18_1 is alternately connected with either of its own sampling capacitor or the sampling capacitor at the next stage (note that this is the same for all integrators including active SC integrators, but the passive integrator at the last stage, for a third-order or greater ΔΣ-modulator; the same shall apply hereafter). Therefore, by appropriately designing the circuit in the ΔΣ-modulator 10, the unity gain frequencies fu of the feedback loop of the operational amplifier 40 for the sampling phase φ1 and for the integration phase φ2, respectively, can be kept the upper limit fu_max that is determined by the phase margin of the operational amplifier 40, and the unity gain frequencies fu can be equalized as well as maximized. Therefore, according to according to the present embodiment, the settling time constant τ of the active SC integrator 18_1 can be set to the shortest, with which it is possible to make the active SC integrator 18_1 perform the settling operation at the highest speed, and perform sampling at the highest frequency that is determined by the performance of the operational amplifier 40.

Also, in the present embodiment, the integrator 18_2 positioned at the last stage is a passive integrator that does not use an amplifier circuit, but is an integrator configured with a switched capacitor. A passive integrator has essentially no problems with oscillation stability because it has no feedback loop of an operational amplifier. Therefore, by using a passive integrator as the integrator 18_2 at the last stage, it is possible to avoid degradation of oscillation stability of the integrator 18_2 at the last stage during the sampling phase φ1.

The settling time constant of the passive integrator 18_2 is determined by a time constant based on the switching resistances of the switches S21, S22, and S23, and the capacitances of the capacitors Cs2 and Cf2 where the switching resistances are changed with sizes of the switches. Specifically, the switching resistances are lowered, for example, by making the gate width/gate length (W/L) of MOS transistors greater that constitute the switches S21, S22, and S23. In this regard, by making the sizes of the switches S21, S22, and S23 greater to lower the switching resistances, the settling time constant of the passive integrator 18_2 can be shortened. Thus, according to the present embodiment, settling operation of the passive integrator 18_2 can be sped up. Also, speeding up the settling operation of the passive integrator 18_2 can be easily realized because it is not required to additionally connect pseudo load capacitance such as a capacitor with the integrator at the last stage for band restriction when speeding up the settling operation of the passive integrator 18_2. Therefore, it is possible to speed up the settling time constant of the integrator 18_2 at the last-stage by a simple configuration.

Therefore, according to the present embodiment, it is possible to have all of the integrators 18_1-18_2 that constitute the ΔΣ-modulator 10 operate at the fastest settling time constant that is determined by the highest unity gain frequency fu_max of the operational amplifier 40. As a result, the sampling frequency of the ΔΣ-modulator 10 as a whole can be sped up to its maximum.

Also, in the present embodiment, operational amplifiers included in the ΔΣ-modulator 10 can be reduced because the integrator 18_2 at the last-stage is a passive integrator that does not use an amplifier circuit when compared with that uses an active SC integrator using an amplifier circuit. As a result, the size of the circuit can be reduced to realize a smaller chip area and lower power consumption.

Also, in the present embodiment, the quantizer 20 (namely, the comparator 44) is connected at the following stage of the integrator at the last stage in the ΔΣ-modulator 10. A latched comparator may be used as the comparator 44 that synchronizes with a clock to perform its comparison operation at the rise edge or fall edge of the clock. Such a latched comparator needs a certain length of operation time to settle an output value (high or low) after starting its comparison operation based on the clock input. It may take a longer time for settling the output especially when the differential input is small (metastability). To avoid malfunction of the ΔΣ-modulator caused by metastability, it is necessary to sufficiently secure the operation time of the latched comparator to settle the output, and to perform the comparison operation after the integrator at the last stage, which is connected at the following stage of the comparator 44, completes an integral operation. In this regard, if all of the integrators in the ΔΣ-modulator have the same configuration, there is a possibility that the operation speed of the ΔΣ-modulator as a whole is restricted because calculation time is required for a comparison operation by the comparator 44 after the integrators have completed the integral operations.

Figure 6:
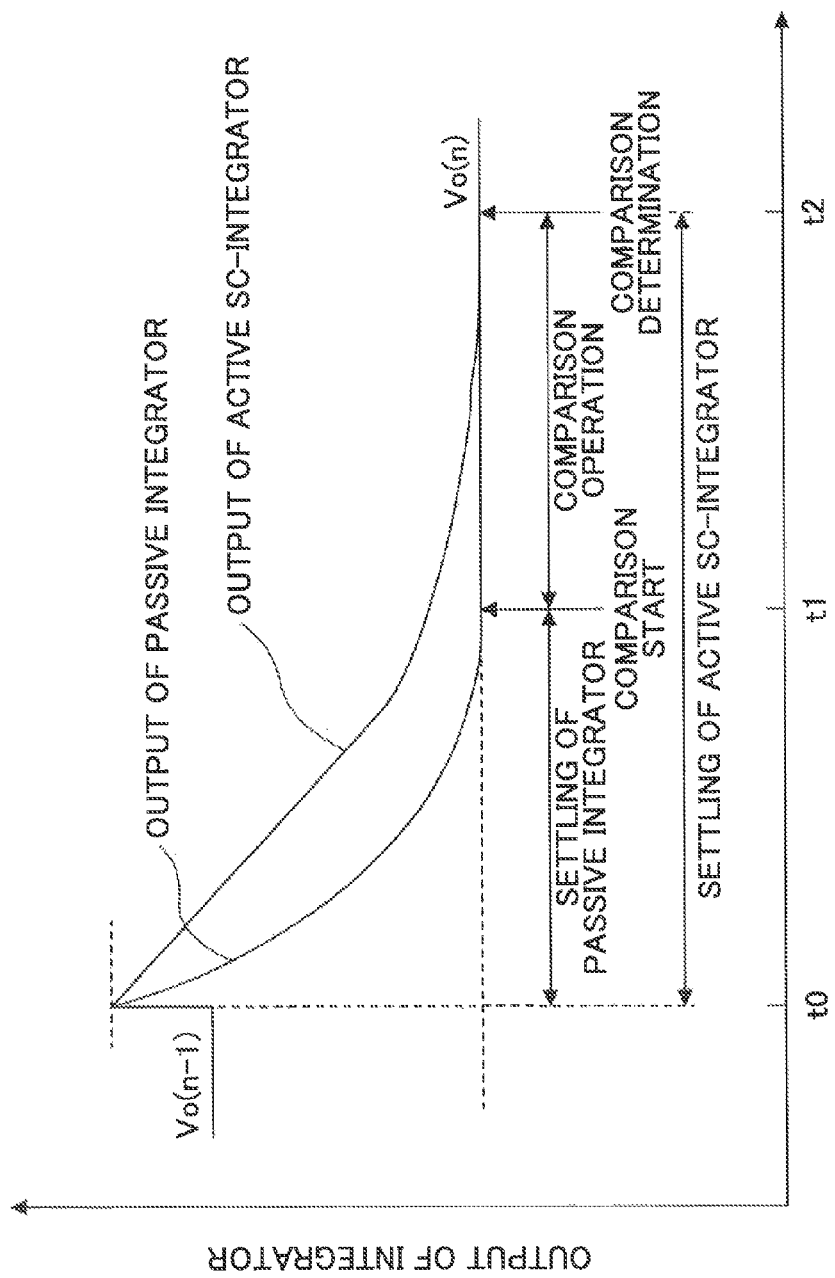
FIG. 6 is a schematic view illustrating a circuit operation in a ΔΣ-modulator according to the present embodiment.

FIG. 6 is a schematic view illustrating a circuit operation in the ΔΣ-modulator 10 according to the present embodiment. Note that, in general, the gain of a passive integrator that does not use an amplifier circuit is set smaller than the gain of an active SC integrator that uses an amplifier circuit, and hence, the output amplitude of the passive integrator is smaller than the output amplitude of the active SC integrator. FIG. 6 illustrates a comparison view of the output settling waveforms of the passive integrator and the active SC integrator where the output amplitude (vertical axis) of the integrators is enlarged.

In contrast to this, in the present embodiment, the integrator 18_2 at the last stage in the ΔΣ-modulator 10 is a passive integrator that does not use an amplifier circuit, and the integrator 18_1 at the preceding stage is an active SC integrator that uses an amplifier circuit. The passive integrator that does not use an amplifier circuit has no restriction of oscillation stability because there is no feedback loop of the operational amplifier as described above, and has virtually no operation speed limit due to the maximum output change (slew rate) of the operational amplifier. Note that although there is an due to the saturation current of a switch constituted with MOS transistors, it is easy to sufficiently speed up by appropriately designing sizes of the switches such as the MOS transistor size (=aspect ratio W/L). Therefore, the passive integrator can realize considerably faster settling operation than the active SC integrator.

Therefore, in the present embodiment, by configuring to have a passive integrator as the integrator 18_2 at the last stage, a settling operation of the integrator 18_2 at the last stage can be completed before the completion of a settling operation of the other integrator (active SC integrator) 18_1 as shown in FIG. 6. As a result, a comparison operation of the comparator 44 at the following stage can be started before the completion of the settling operation of the other integrator (active SC integrator) 18_1 (at time t1), and the output value of the comparison operation by the quantizer 20 (the comparator 44) can be settled when the other integrator (active SC integrator) 18_1 completes its settling operation (at time t2).

Therefore, according to the ΔΣ-modulator 10 in the present embodiment, a time margin can be secured between the output settlement of the comparator 44 and the output timing of the D/A converter 22, the demand for operation speed of the comparator 44 and the D/A converter 22 can be relaxed, metastability of the comparator 44 can be avoided, and consequently, it is possible to have the ΔΣ-modulator operate faster and more stably as a whole.

Note that, in the first embodiment above, the operational amplifier 40 corresponds to an "amplifier circuit" described in the claims, the sampling phase φ1 corresponds to a "first operation phase" described in the claims, the integration phase φ2 corresponds to a "second operation phase" described in the claims, the difference signal generator 16 corresponds to a "difference signal generator" described in the claims, the integrator 18 corresponds to a "integral unit" described in the claims, the quantizer 20 and the comparator 44 corresponds to a "quantizer" described in the claims, and the D/A converter 22 corresponds to a "D/A converter" described in the claims.

Second Embodiment

In the first embodiment above, the integrator (passive integrator) 18_2 at the last stage in the ΔΣ-modulator 10 is configured with a single end circuit. In contrast to this, in a second embodiment of the present invention, an integrator (passive integrator) at the last stage is configured with a full differential circuit in which both input and output have differential configurations.

In general, in an active SC integrator in a ΔΣ-modulator, if the gain of an operational amplifier is sufficiently high during an integration phase φ2, differential input ((Vi−)−(Vi+)) of the operational amplifier becomes virtually zero after an settling operation, and virtually all electric charge accumulated in a sampling capacitor Cs is transferred to an integration capacitor Cf, which makes the active SC integrator an ideal integrator having virtually no integrator leak.

On the other hand, in a passive integrator during an integration phase φ2, not virtually all electric charge accumulated in a sampling capacitor Cs is transferred to an integration capacitor Cf, and integrator leak is generated with electric charge remaining in the sampling capacitor Cs, and hence, the passive integrator is not an ideal integrator. If the generated integrator leak is great, an ideal noise shape characteristic cannot be obtained, performance degradation may occur such as increased quantization noise in the band.

In a passive integrator, the integrator leak is a ratio of leak out from an integrator after a single integral operation, and is represented by (1−c), neglecting parasitic capacitance, where c represents a ratio of electric charge (note that c=Cf/(Cs+Cf) is satisfied, see FIG. 2) transferred from the sampling capacitor to the integration capacitor after the single integral operation. Also, the gain "a" of the passive integrator at the last stage is represented by Cs/(Cs+Cf).

$$1-c=a=Cs/(Cs+Cf)=1/(1+(Cf/Cs)) \qquad (10)$$

In this regard, neglecting the parasitic capacitance and the like, the integrator leak in the passive integrator at the last stage is proportionate or equivalent to the output/input gain of the integrator as shown in formula (10) above. To make the integrator leak smaller in the passive integrator to bring it closer to an ideal integrator, the capacitance value of the integration capacitor Cf needs to be sufficiently great relative to the capacitance value of the sampling capacitor Cs, and the gain of the integrator needs to be smaller.

Note that, as described in the first embodiment, to equalize and maximize the unity gain frequencies during both the sampling phase φ1 and the integration phase φ2 of the active SC integrator at the preceding stage, the sampling capacitor Cs of the passive integrator at the following stage needs to have a capacitance value that is great to a certain extent, and the capacitance value of the sampling capacitor Cs of the passive integrator cannot be set too small. To make the ratio of (Cf/Cs) great enough for a capacitance value given to the sampling capacitor Cs of the passive integrator, the capacitance value of the integration capacitor Cf needs to be set greater.

In an integrated circuit in general, a large-capacity capacitor increases the chip area because a capacitor increases its occupied chip area proportionate to the magnitude of its capacitance value. Furthermore, about a two-fold element area is required for configuring a full differential circuit because it includes a pair (two pieces) of an element. In this regard, a passive integrator configured by a full differential circuit needs to have a pair (two pieces) of large-capacity integration capacitors to make the integrator leak small, which makes the integration capacitor occupy a large chip area, and makes the cost higher.

Figure 7:
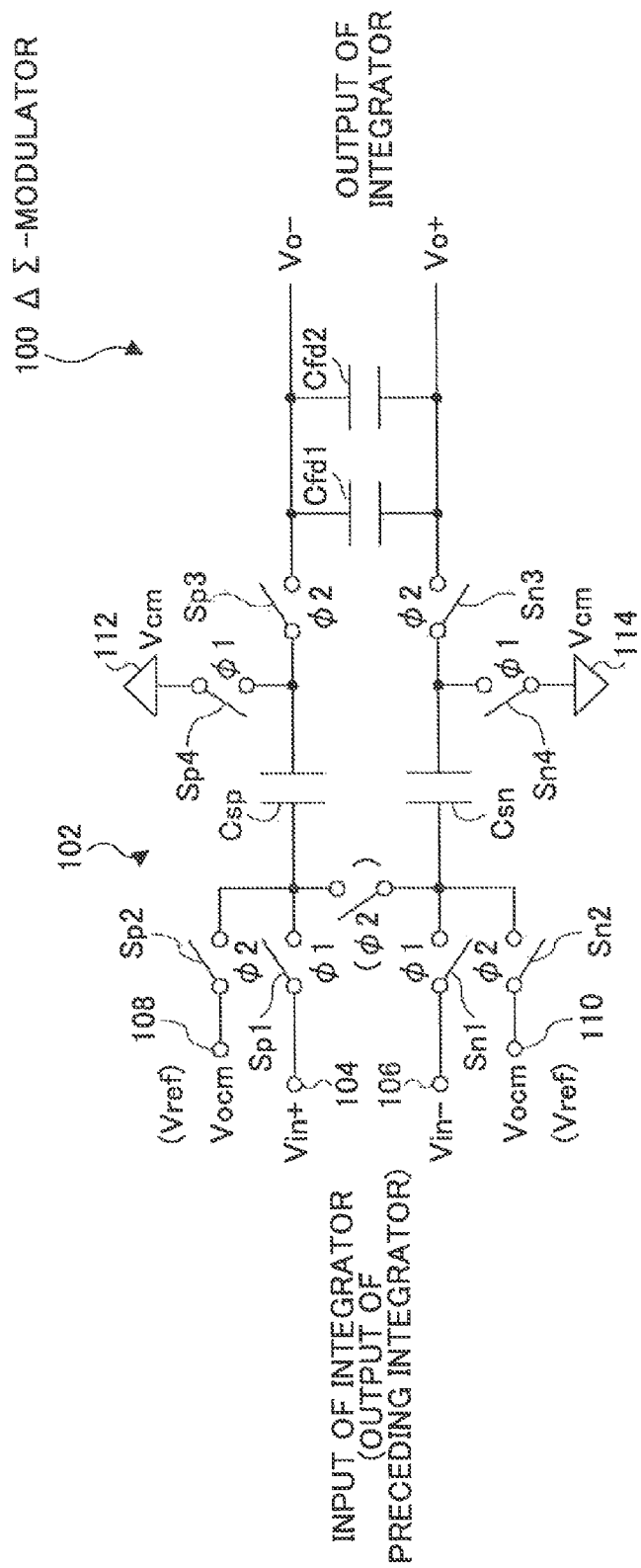
FIG. 7 is a core part of a circuit diagram of a ΔΣ-modulator according to a second embodiment of the present invention.

FIG. 7 is a core part of a circuit diagram of a ΔΣ-modulator 100 according to the second embodiment of the present invention. The present embodiment is an example of a ΔΣ-A/D converter that is implemented by using the ΔΣ-modulator 100 in which both input and output in the ΔΣ-A/D converter 12 in the first embodiment are changed to have differential configurations.

The ΔΣ-modulator 100 in the present embodiment receives a pair of analog input signals (analog input potentials) as input with the differential configuration. The ΔΣ-modulator 100 includes a passive integrator 102 positioned at the last stage. The integrator 102 receives differential analog potentials Vin+ and Vin− as input that are output from an active SC integrator position at the preceding stage of the passive integrator 102. The passive integrator 102 includes a pair of sampling capacitors Csp and Csn that can sample the input analog potentials Vin+ and Vin−. The pair of sampling capacitors Csp and Csn have substantially the same capacitance.

The input side terminal of the sampling capacitor Csp is connected with an input terminal 104 via a switch Sp1. Also, the input side terminal of the sampling capacitor Csn is connected with an input terminal 106 via a switch Sn1. The input terminal 104 receives the analog input potential Vin+ as input from the active SC integrator, and the input terminal 106 receives the analog input potential Vin− as input from the active SC integrator. The switch Sp1 is a switch to make the input side terminal of the sampling capacitor Csp conducted to or disconnected from and the input terminal 104, and the switch Sn1 is a switch to make the input side terminal of the sampling capacitor Csn conducted to or disconnected from and the input terminal 106.

When the switch Sp1 is in an on-state, the first sampling capacitor Csp can accumulate electric charge that is input via the switch Sp1 in accordance with analog input potential Vin+ from an active SC integrator at the preceding stage, and samples the analog input potential Vin+ from the active SC integrator at the preceding stage with the accumulated input electric charge. Also, when the switch Sn1 is in an on-state, the first sampling capacitor Csn can accumulate electric charge that is input via the switch Sn1 in accordance with analog input potential Vin− from the active SC integrator at the preceding stage, and samples the analog input potential Vin− from the active SC integrator at the preceding stage with the accumulated input electric charge.

The input side terminal of the first sampling capacitor Csp is also connected with a reference terminal 108 via the switch Sp2, and the input side terminal of the first sampling capacitor Csn is also connected with a reference terminal 110 via the switch Sn2. The switch Sp2 is a switch to make the reference terminal 108 conducted to or disconnected from the input side terminal of the sampling capacitor Csp, which makes the input side terminal of the sampling capacitor Csp connected with or disconnected from the reference terminal 108. The switch Sn2 is a switch to make the reference terminal 110 conducted to or disconnected from the input side terminal of the sampling capacitor Csn, which makes the input side terminal of the sampling capacitor Csn connected with or disconnected from the reference terminal 110.

When it is time to perform summing integration by transferring electric charge accumulated in the first sampling capacitor Csp, the switch Sp2 makes the reference terminal 108 conducted to the input side terminal of the sampling capacitor Csp, or when it is not time to perform summing integration by transferring electric charge accumulated in the sampling capacitor Csp, it makes the reference terminals 108 disconnected from the input side terminal of the sampling capacitor Csp. When it is time to perform summing integration by transferring electric charge accumulated in the first sampling capacitor Csn, the switch Sn2 makes the reference terminal 110 conducted to the input side terminal of the sampling capacitor Csn, or when it is not time to perform summing integration by transferring electric charge accumulated in the sampling capacitor Csn, it makes the reference terminals 110 disconnected from the input side terminal of the sampling capacitor Csn.

The reference terminal 108 and the reference terminal 110 have an output common mode potential Vocm (or reference potential Vref) supplied. The supplied potential operates as an analog feedback signal output from the D/A converter of the ΔΣ-modulator 100. Both the first and second reference potentials Vref+ and Vref− operate as analog feedback signals output from the D/A converter 22. When the switches Sp2 and Sn2 are in on-states, the sampling capacitors Csp and Csn can transfer electric charge input from the reference potentials Vref+ and Vref− as references, through the switches Sp2 and Sn2, respectively.

The ΔΣ-modulator 100 includes a comparator (not shown) as a quantizer positioned at the following stage of the passive integrator 102. Differential analog potentials Vo+ and Vo− output from the passive integrator 102 are input into the differential input terminals of the comparator. Specifically, the output side terminal of the sampling capacitor Csp is connected with an inverted input terminal of the comparator via a switch Sp3. Also, the output side terminal of the second sampling capacitor Csn is connected with a non-inverted input terminal of the comparator via the switch Sn3. The switch Sp3 is a switch to make the output side terminal of the sampling capacitor Csp conducted to or disconnected from the inverted input terminal of the comparator, and the switch Sn3 is a switch to make the output side terminal of the sampling capacitor Csn conducted to or disconnected from the non-inverted input terminal of the comparator.

Capacitors Cfd are connected between the inverted input terminal and non-inverted output terminal of the comparator (namely, between the differential output terminals of the passive integrator 102). The capacitors Cfd includes two capacitors Cfd1 and Cfd2 that are connected in parallel in reverse directions to each other. The capacitors Cfd (namely, the capacitors Cfd1 and Cfd2) are temporary storage capacitors to which electric charge accumulated in the sampling capacitors Csp and Csn is transferred. In the following, the capacitor Cfd is referred to as the "integration capacitor Cfd". Note that the capacitance of the capacitors Cfd is set to a value greater than the capacitance of the sampling capacitor Csp and Csn.

Also, the capacitance of the integration capacitor Cfd1 is substantially the same as the capacitance of the integration capacitor Cfd2.

The output side terminal of the sampling capacitor Csp is also connected with a reference terminal 112 via a switch Sp4. Also, the output side terminal of the sampling capacitor Csn is also connected with a reference terminal 114 via the switch Sp4. The reference terminals 112 and 114 receive a predetermined common mode potential Vcm as input.

In the ΔΣ-modulator 100 in the present embodiment, when the differential analog input potentials (namely, differential analog output potentials from the active SC integrator at the preceding stage) Vin+ and Vin− are sampled at the passive integrator 102, the switches Sp1, Sn1, Sp4, and Sn4 are turned on, and the switches Sp2, Sn2, Sp3, and Sn3 are turned off. When the switches take these on/off states, a potential difference between the analog input potential Vin+ and the common mode potential Vcm input into the input terminal 104 (input voltage) is applied to both terminals of the sampling capacitor Csp, and a potential difference between the analog input potential Vin− and the common mode potential Vcm input into the input terminal 106 (input voltage) is applied to both terminals of the sampling capacitor Csn.

In this case, electric charge (input electric charge) that corresponds to the analog input potential Vin+ relative to the input common mode potential Vcm as the reference is accumulated into the sampling capacitor Csp, and electric charge (input electric charge) that corresponds to the analog input potential Vin− relative to the input common mode potential Vcm as the reference is accumulated into the sampling capacitor Csn. Therefore, during the sampling phase $\phi 1$, electric charge (input electric charge) corresponding to the analog input potential Vin+ is sampled at the sampling capacitor Csp using the common mode potential Vcm as the reference, and electric charge (input electric charge) corresponding to the analog input potential Vin− is sampled at the sampling capacitor Csn using the common mode potential Vcm as the reference.

When the sampling of the analog input potentials Vin+ and Vin− is completed at the sampling capacitors Csp and Csn to have the capacitors Csp and Csn accumulate the input electric charge corresponding to the analog input potentials Vin+ and Vin−, next, the electric charge accumulated in the sampling capacitors Csp and Csn is transferred to the integration capacitors Cfd to perform summing integration.

When performing the summing integration during the integration phase $\phi 2$, the switches Sp1, Sn1, Sp4, and Sn4 are turned off, and the switches Sp2, Sn2, Sp3, and Sn3 are turned on. Note that the sampling during the sampling phase $\phi 1$ and the integration during the integration phase $\phi 2$ are performed at timings different from each other, and the sampling phase $\phi 1$ and the integration phase $\phi 2$ are alternately repeated without temporally overlapped.

Once the switches take these on/off states, the input side terminals of the sampling capacitors Csp and Csn have the output common mode potential Vocm (or the reference potential Vref) applied, and the sampling capacitors Csp and Csn are connected with the integration capacitors Cfd, and both terminals of the integration capacitors Cfd are connected with the output side terminals of the sampling capacitors Csp and Csn. Note that the input side terminals of the sampling capacitors Csp and Csn may be connected with each other by the switches during the integration phase $\phi 2$.

In this case, the electric charge accumulated in the sampling capacitors Csp and Csn that corresponds to the output potentials Vin+ and Vin− of the active SC integrator at the preceding stage is transferred to the integration capacitors Cfd using the output common mode potential Vocm (or the reference potential Vref) as the reference. When the transfer is performed, the voltage generated between both terminals of the integration capacitors Cfd takes a value that corresponds to the sampling capacitors Csp and Csn, the integration capacitors Cfd, and the output potentials Vin+ and Vin− of the active SC integrator at the preceding stage. Therefore, during the integration phase φ2, using the input common mode potential Vicm as the reference, a differential analog potential that corresponds to the sampling capacitors Csp and Csn, the integration capacitors Cfd, and the output potential Vin+ and Vin− of the active SC integrator at the preceding stage is input into the differential input terminals of the comparator as the output potentials Vo+ and Vo− of the passive integrator 102.

The comparator positioned at the following stage of the passive integrator 102 outputs comparison results of the differential analog potentials Vo+ and Vo− input into the differential input terminals, as a digital signal sequence to supply to a D flip-flop (not shown). Thus, the ΔΣ-modulator 100 converts the differential analog input potentials into the digital signal sequence.

The ΔΣ-modulator 10 in the present embodiment is an n-th order ΔΣ-modulator that has n (two or more) pieces of integrators connected, including the passive integrator 102 that does not use an amplifier circuit at the last stage, and an active SC integrator that uses an amplifier circuit and a switched capacitor at the preceding stage to the last stage. This active SC integrator is alternately connected with either of the sampling capacitor Cs of its own or the sampling capacitor Cs at the next stage. Therefore, similarly to the first embodiment, the settling time constant τ of the active SC integrator can be set to the shortest, with which it is possible to make the active SC integrator perform the settling operation at the highest speed, and perform sampling at the highest frequency that is determined by the performance of the operational amplifier.

Also, the integrator 102 at the last stage is a passive integrator. Therefore, similarly to the first embodiment, it is possible to speed up the settling operation of the passive integrator 102 at the last-stage by a simple configuration while avoiding degradation of oscillation stability of the integrator 102 at the last stage during the sampling phase φ1. Therefore, also in the present embodiment, it is possible to have all of the integrators that constitute the ΔΣ-modulator 100 operate at the fastest settling time constant that is determined by the highest unity gain frequency fu_max of the operational amplifier. As a result, the sampling frequency of the ΔΣ-modulator 100 as a whole can be sped up to its maximum.

Moreover, also in the present embodiment, operational amplifiers included in the ΔΣ-modulator 100 can be reduced because a passive integrator is used as the integrator 102 at the last stage. As a result, the size of the circuit can be reduced to realize a smaller chip area and lower power consumption. Furthermore, the settling operation of the integrator 102 at last-stage can be completed before the completion of the settling operation of the other integrator (active SC integrator), and a comparison operation of the quantizer 20 (the comparator 44) at the following stage can be started before the completion of the settling operation of the other integrator (active SC integrator), which makes it possible to have the ΔΣ-modulator operate faster and more stably as a whole.

Incidentally, a capacitor formed in an integrated circuit includes in general a lower electrode and an upper electrode. As parasitic capacitance exists between the lower electrode and a substrate due to a structural reason, if a single capacitors connected between differential outputs of an integrator, the parasitic capacitances of the electrodes do not balance and become asymmetric. It is not preferable for a differential circuit to exhibit this phenomenon.

Therefore, the integration capacitor Cfd of the passive integrator 102 at the last stage is partitioned into the two integration capacitors Cfd1 and Cfd2 in the present embodiment. The capacitance of the integration capacitor Cfd1 is substantially the same as the capacitance of the integration capacitor Cfd2, the integration capacitors Cfd1 and Cfd2 are connected in parallel in reverse directions to each other. Therefore, the passive integrator 102 in the ΔΣ-modulator 100 can have the positive side and the negative side of the differential circuit balanced, and desirable operations of all differential circuits can be realized.

Figure 8:
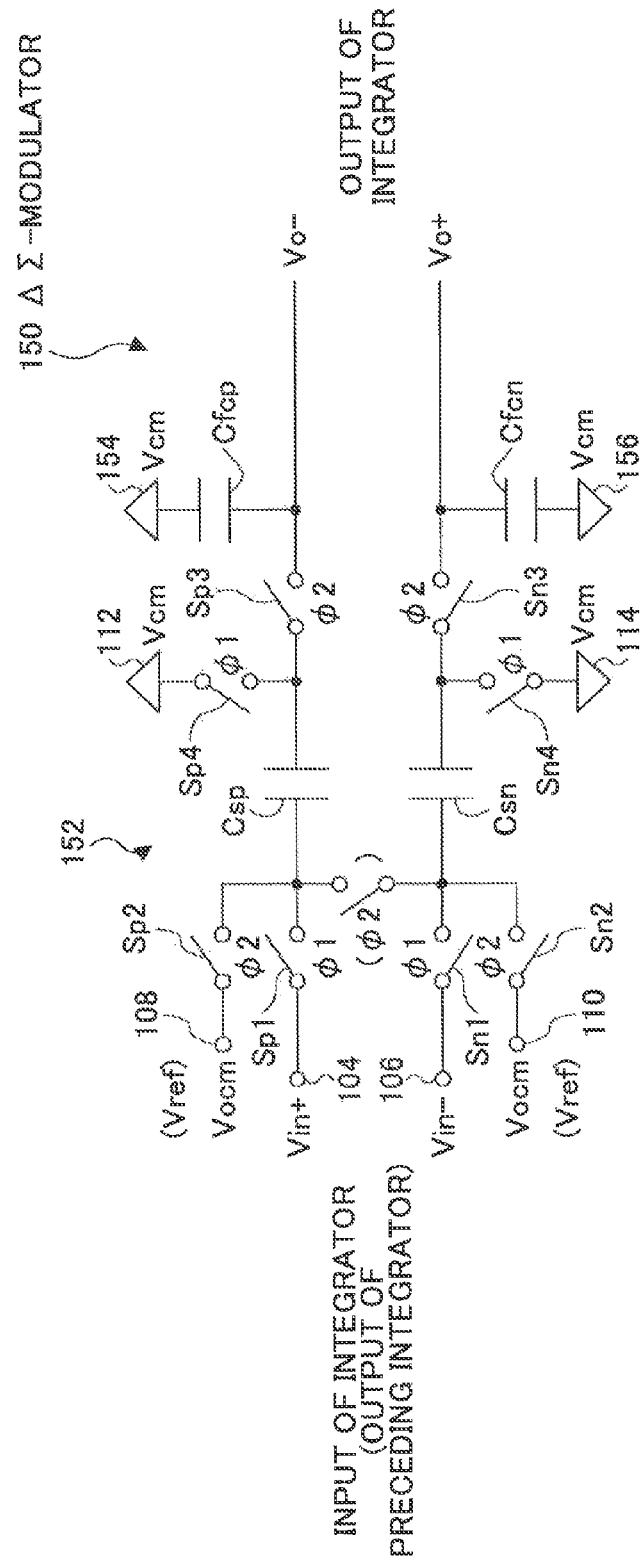
FIG. 8 is a core part of a circuit diagram of a contrastive ΔΣ-modulator contrasted with the present embodiment.

Furthermore, the ΔΣ-modulator 100 in the present embodiment has the following effects. In the following, the effects of the ΔΣ-modulator 100 in the present embodiment will be described by contrasting with a contrastive ΔΣ-modulator 150 shown in FIG. 8. Note that the same numerical codes are assigned to the same parts in FIG. 8 as in the configuration in FIG. 7, and their description is omitted. Cs(eff) and Cf(eff) respectively denote effective capacitances of the sampling capacitor Cs and the integration capacitor Cf when viewed from the side of the differential outputs Vo+ and Vo− of the passive integrator.

The contrastive ΔΣ-modulator 150 is assumed to include a contrastive passive integrator 152 positioned at the last stage. Being different from the passive integrator 102 of the ΔΣ-modulator 100 in the present embodiment, the contrastive passive integrator 152 does not include integration capacitors connected between the inverted input terminal and the non-inverted input terminal of the comparator (namely, between the differential output terminals of the passive integrator 102), but includes two integration capacitors Cfcp and Cfcn. The integration capacitor Cfcp is assumed to be connected between the inverted input terminal of the comparator and a reference terminal 154 to which the common mode potential Vcm is input. Also, the integration capacitor Cfcn is assumed to be connected between the non-inverted input terminal of the comparator and a reference terminal 156 to which the common mode potential Vcm is input.

Both in the passive integrator 102 in the present embodiment, and in the contrastive passive integrator 152 of the contrastive ΔΣ-modulator 150, two elements, or the sampling capacitors Csp and Csn, are connected in series when viewed from the differential outputs Vo+ and Vo− during the sampling phase φ1. In this case, the effective capacitance Cs(eff) of the sampling capacitors Csp and Csn is a serially combined capacitance of those of the sampling capacitors Csp and Csn, which is given by the reciprocal of the sum of the reciprocals of the respective capacitance values of the sampling capacitors Csp and Csn.

Assuming that Csp=Csn=Cs0 is satisfied for the capacitance values of the sampling capacitors Csp and Csn, the effective capacitance Cs(eff) is represented by the next formula (11) for both the passive integrator 102 and the contrastive passive integrator 152, which is half of the capacitance value Cs0 of the pair of sampling capacitors Csp and Csn.

$$Cs(\text{eff})=1/((1/Csp)+(1/Csn))=(1/2)\cdot Cs0 \quad (11)$$

On the other hand, the passive integrator 102 in the present embodiment and the contrastive passive integrator 152 have circuit connections different from each other, and hence, they have different effective capacitances Cf(eff) of the integration capacitors Cf from each other when viewed from the side of the differential outputs Vo+ and Vo− during the integration phase φ2.

In the contrastive passive integrator 152, the integration capacitors Cfcp and Cfcn appear as connected in series when viewed from the side of the differential outputs Vo+ and Vo− during the integration phase φ2. Therefore, assuming that Cfcp=Cfcn=Cfc0 is satisfied for the capacitance values of the integration capacitors Cfcp and Cfcn, the effective capacitance Cf(eff) of the integration capacitors Cf viewed from the side of the differential outputs Vo+ and Vo− is represented by the next formula (12), which is half of the capacitance value Cfc0 of the pair of integration capacitors Cfcp and Cfcn.

$$Cf(\text{eff})=1/((1/Cfcp)+(1/Cfcn))=(1/2)\cdot Cfc0 \quad (12)$$

Also, in the passive integrator 102, the integration capacitors Cfd1 and Cfd2 appear as connected in parallel when viewed from the side of the differential outputs Vo+ and Vo− during the integration phase φ2. Therefore, assuming that Cfd1=Cfd2=Cfd0 is satisfied for the capacitance values of the integration capacitors Cfd1 and Cfd2, the effective capacitance Cf(eff) of the integration capacitors Cf viewed from the side of the differential outputs Vo+ and Vo− is represented by the next formula (13), which is the sum (twice) of the capacitance values of the pair of integration capacitors Cfd1 and Cfd2, or Cfd0

$$Cf(\text{eff})=Cfd1+Cfd2=2\cdot Cfd0 \quad (13)$$

Namely, comparing the ΔΣ-modulator 100 in the present embodiment with the contrastive ΔΣ-modulator 150 that have the same element area for the integration capacitors and are configured with the same number of elements, the passive integrator 102 of the ΔΣ-modulator 100 in the present embodiment has virtually four times greater effective capacitance Cf(eff) than that of the contrastive ΔΣ-modulator 150 when viewed from the side of the differential outputs Vo+ and Vo−.

Even if configured with a full differential circuit, a passive integrator can make the integrator leak smaller by making the ratio of the capacitance value of the integration capacitor Cf over the capacitance value of the sampling capacitor Cs (=Cf/Cs) equivalently greater. Neglecting the parasitic capacitance or the like, both the passive integrator 102 in the present embodiment and the contrastive passive integrator 152 have the integrator leak that is equivalent to the output/input gain of the integrator. In this case, the integrator leak of the contrastive passive integrator 152 is represented by the next formula (14), and the integrator leak of the passive integrator 102 in the present embodiment is represented by the next formula (15).

$$(1-c)=(1/2)\cdot Cs0/((1/2)\cdot Cs0+(1/2)\cdot Cfc0)=Cs0/(Cs0+Cfc0) \quad (14)$$

$$(1-c)=(1/2)\cdot Cs0/((1/2)\cdot Cs0+2\cdot Cfd0)=Cs0/(Cs0+4\cdot Cfd0) \quad (15)$$

Therefore, it is sufficient for the passive integrator 102 in the present embodiment to have the capacitance value of the integration capacitor that is quarter of that of the contrastive passive integrator 152 to obtain the same integrator leak. Namely, compared to the contrastive passive integrator 152, the integrator leak and the integrator gain can be suppressed smaller, and especially if Cs0<<Cfc0=Cfd0 is satisfied, the integrator leak can be reduced to quarter while the integration capacitor has the same size. Therefore, compared to the contrastive passive integrator 152, the ΔΣ-modulator 100 in the present embodiment can reduce the integrator leak and the integral gain with the four times greater area efficiency of the integration capacitor, which makes it possible to have the smaller circuit device.

Note that, in the second embodiment, sampling capacitors Csp and Csn correspond to "a pair of sampling capacitors" described in the claims, and integration capacitors Cfd, Cfd1 and Cfd2 corresponds to "integration capacitors" described in the claims.

Figure 9:
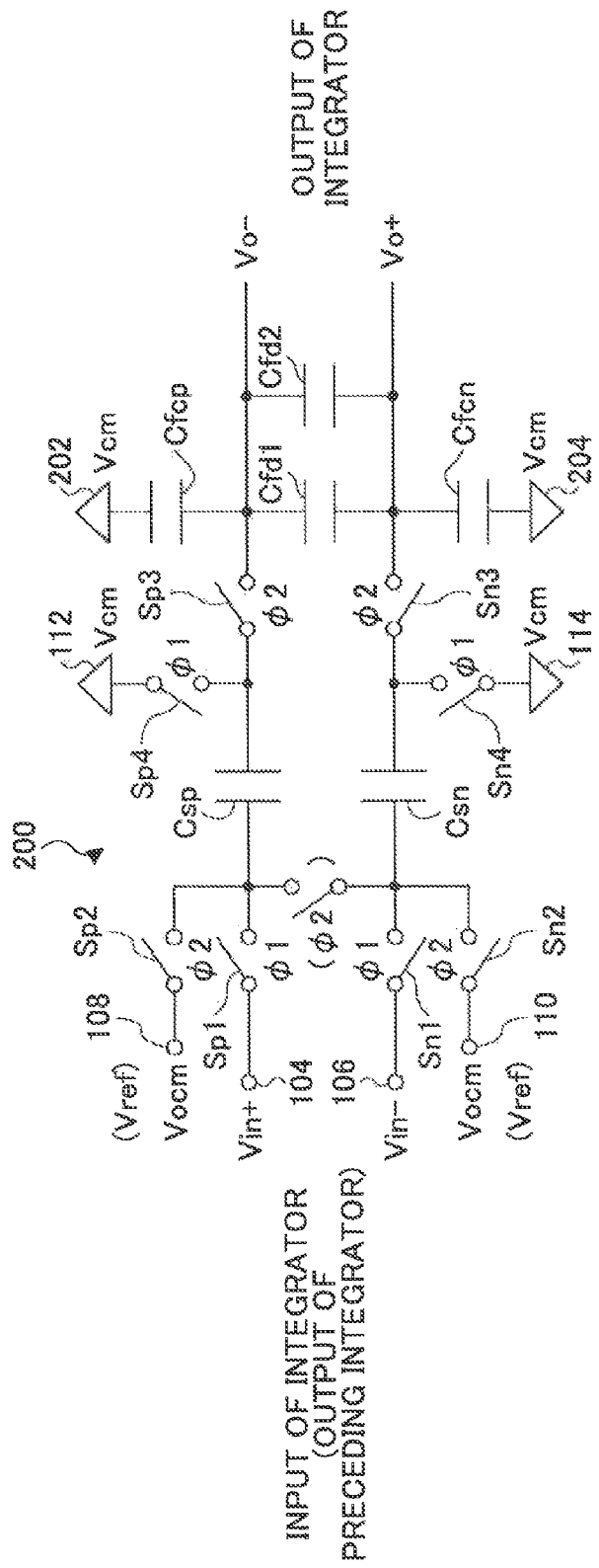
FIG. 9 is a core part of a circuit diagram of a ΔΣ-modulator according to a modified example of the present invention.

Incidentally, in the second embodiment, the integration capacitors Cfd1 and Cfd2 are connected between the inverted input terminal and the non-inverted input terminal of the comparator (namely, between the differential output terminals of the passive integrator 102). In addition to having these integration capacitors Cfd1 and Cfd2 connected between the inverted input terminal and the non-inverted input terminal of the comparator, as shown in FIG. 9, a passive integrator 200 may have capacitors connected between the common mode and the respective differential output terminals. Namely, a capacitor Cfcp is connected between the inverted output terminal of the passive integrator 200 (the inverted input terminal of the comparator 44) and the common mode (reference terminal 202), and a capacitor Cfcn is connected between the non-inverted output terminal of the passive integrator 200 (the non-inverted input terminal of the comparator 44) and the common mode (reference terminal 204). Note that both the reference terminals 202 and 204 receive the predetermined common mode potential Vcm as input.

In the passive integrator 200 modified as above, the capacitors Cfcp and Cfcn operate to stabilize the common mode potential of the output of the passive integrator. In general, a capacitor formed in an integrated circuit has a parasitic capacitance between the lower electrode and a substrate having the magnitude of several dozen percentages, which can stabilize the common mode potential to a certain extent. By additionally connecting the capacitors Cfcp and Cfcn as above, stability of the common mode potential can be further improved. Note that, assuming that Cfcp=Cfcn=Cfc0 is satisfied in this passive integrator 200, the integrator leak (1−c) is represented by the next formula (16). Therefore, the passive integrator 200 can further reduce the integrator leak and the integrator gain compared to the passive integrator 102 in the second embodiment.

$$(1-c)=Cs0/(Cs0+4\cdot Cfd0+Cfc0) \quad (16)$$

Also, in the second embodiment, the sampling capacitors Csp and Csn, which sample the analog input potentials Vin+ and Vin−, share the D/A converter that performs feedback of the reference voltage Vref depending on the output of the quantizer, for addition/subtraction at the integrators. However, the present invention is not limited to that, but as shown in FIGS. 10-11, for each of the integrators, aside from the sampling capacitors Csp and Csn, sampling capacitors Crefp and Crefn for the reference voltage may be provided to sample the reference potentials Vref+ and Vref− (sampling capacitors Cref1$p$ and Cref1$n$ for the reference voltage in active SC integrators 300 and 400 at the preceding stage, and sampling capacitors Cref2$p$ and Cref2$n$ for the reference voltage in passive integrators 302 and 402 at the following stage).

Figure 10:
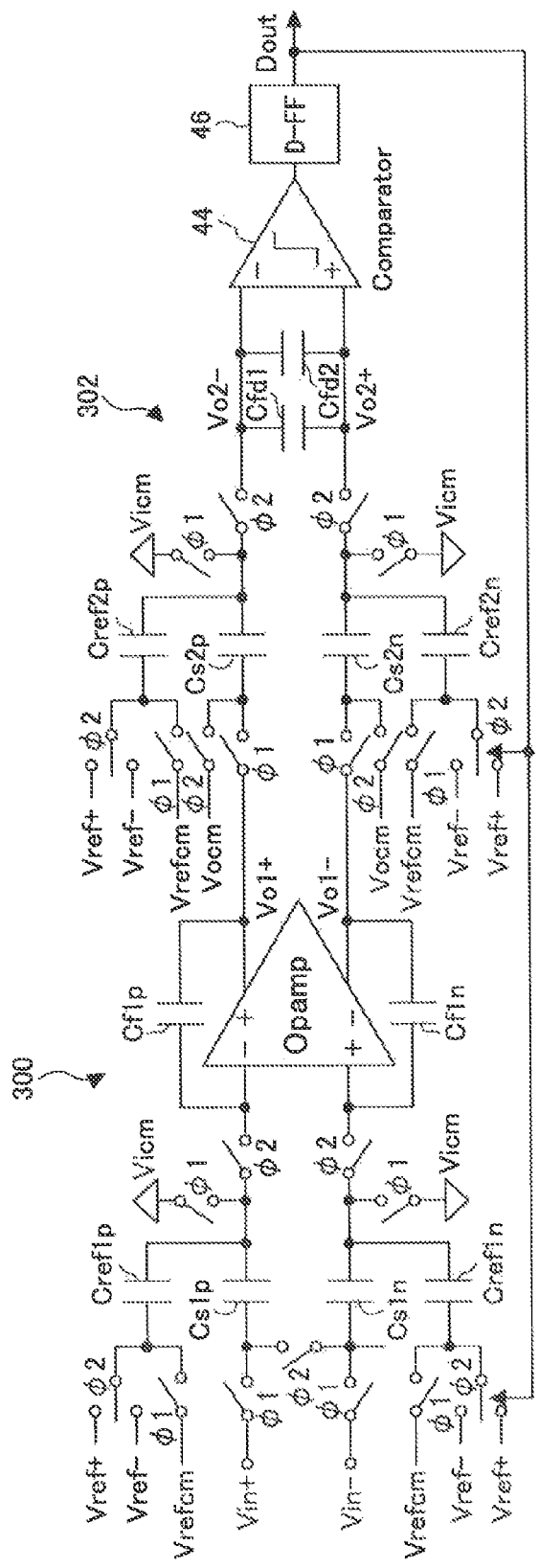
FIG. 10 is a circuit diagram of a ΔΣ-modulator according to a modified example of the present invention.
Figure 11:
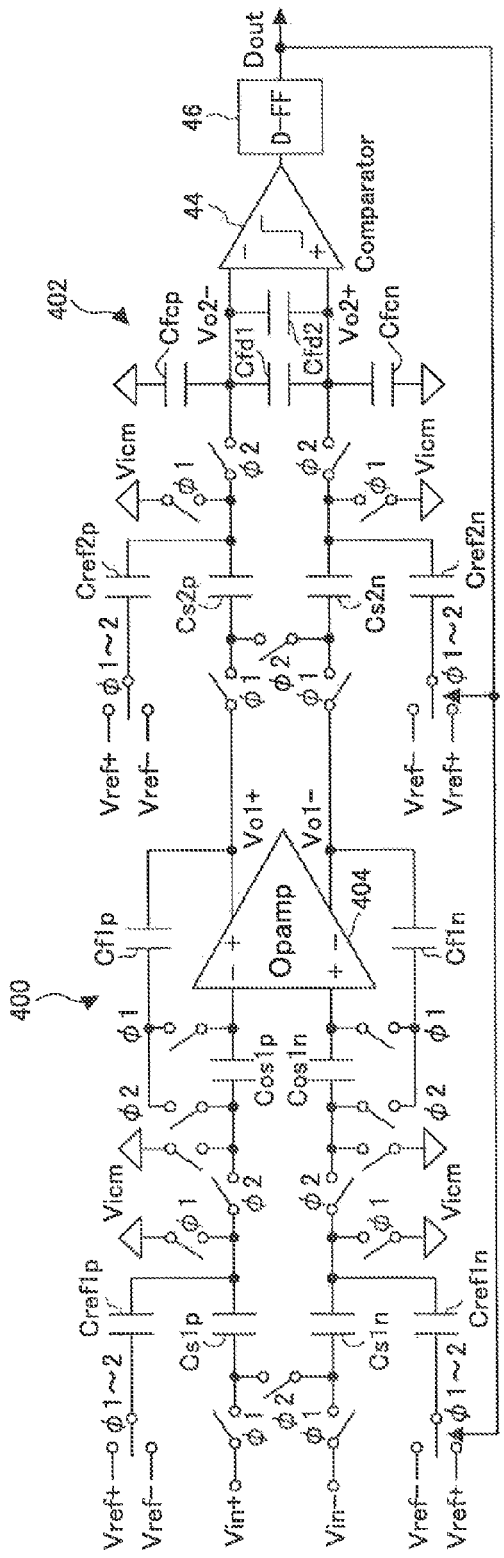
FIG. 11 is a circuit diagram of a ΔΣ-modulator according to a modified example of the present invention.

Note that, in FIGS. 10-11, the active SC integrators 300 and 400 at the preceding stage include sampling capacitors Cs1$p$ and Cs1$n$, integration capacitors Cf1$p$ and Cf1$n$, and differential outputs Vo1+ and Vo1−. Also, the passive integrators 302 and 402 at the following stage include sampling capacitors Cs2$p$ and Cs2$n$, integration capacitors Cfd1 and Cfd2, and the differential output Vo2+ and Vo2−.

In the configuration of the modified example shown in FIG. 10, during the sampling phase φ1, as the sampling capacitors for the reference voltage Crefp and Crefn are connected with a terminal that is a middle point between the reference potential Vref+ and the reference potential Vref− to receive common mode potential Vrefcm for the reference voltage as input, sampling is performed for the common mode potential Vrefcm. On the other hand, during the integration phase φ2, depending on the comparator output, as they are selectively connected with one of the terminals to which the reference potential Vref+ is input, and the terminal to which the reference potential Vref− is input, electric charge accumulated in the sampling capacitors Crefp and Crefn for the reference voltage that corresponds to the common mode potential Vrefcm for the reference voltage is transferred to the integration capacitor Cf (specifically, Cf1p, Cf1n, Cfd1 and Cfd2) to perform integration using the reference potentials Vref+ and Vref− as the references.

Also, in the configuration of the modified example shown in FIG. 11, the common mode potential Vrefcm for the reference voltage is not used, which is used in the configuration of the modified example shown in FIG. 10, connection of the sampling capacitors Crefp and Crefn for the reference voltage is switched between the sampling phase φ1 and the integration phase φ2, depending on the comparator output. With this modified example, the common mode potential Vrefcm for the reference voltage may not be required, which is different from the modified example shown in FIG. 10. Also, the reference voltage Vref (=(Vref+)−(Vref−)) is added or subtracted after being multiplied twofold, the reference voltage becomes 2·(Cref/Cs)·Vref by equivalent input.

Also, in the configuration of the modified example shown in FIG. 11, capacitors Cos1p and Cos1n are provided in the active SC integrator 400 at the preceding stage. During the integration phase φ2, these capacitors Cos1p and Cos1n exist between the differential input terminal of the operational amplifier 404, and the sampling capacitors Cs1p and Cs1n and the sampling capacitors Cref1p and Cref1n for the reference voltage. Also, during the sampling phase φ1, they are serially connected with the integration capacitors Cf1p and Cf1n between the input common mode potential Vicm and the operational amplifier outputs Voi+ and Voi−. With the modified example, existence of the capacitors Cos1p and Cos1n can cancel the circuit offset, which make it possible to have the active SC integrator 400 operate in a voltage range in which high-gain differential output can be maintained.

Third Embodiment

Incidentally, in a ΔΣ-A/D converter, when a DC value in a neighborhood of a certain rational number (u=x/y) is applied as the analog input potential Vin, the ΔΣ-modulator outputs a cyclic sequence, which may generate an unfavorable cycle signal (idle tone). This idle tone tends to be generated when a DC value in a neighborhood of a simple rational number such as 0, 1/2, or 1/3 is applied as the analog input potential Vin, especially for a ΔΣ-modulator of a comparatively low-order such as the first or second-order, and also for a passive integrator having the integrator leak. If a frequency component in the idle tone is included in the signal band of the analog input potential Vin, the idle tone cannot be removed by a digital filter positioned at the following stage of the ΔΣ-modulator, and characteristics may be degraded such as degradation of signal-to-noise ratio (SNR).

To reduce the idle tone in a ΔΣ-A/D converter having a passive integrator at the last stage, one may consider (a) to obtain a noise shape characteristic close to an ideal one by making the integrator leak of the passive integrator smaller; and (b) to use a higher-order ΔΣ-modulator. However, to make the integrator leak in a passive integrator, the integration capacitor needs to be designed extremely large. Therefore, the (a) method above makes the passive integrator occupy a large chip area, and leads to a higher cost. Also, the (b) method above increases the number of stages of the integrators comparatively greater, which also makes the circuit size greater, and leads to a higher cost.

Figure 12:
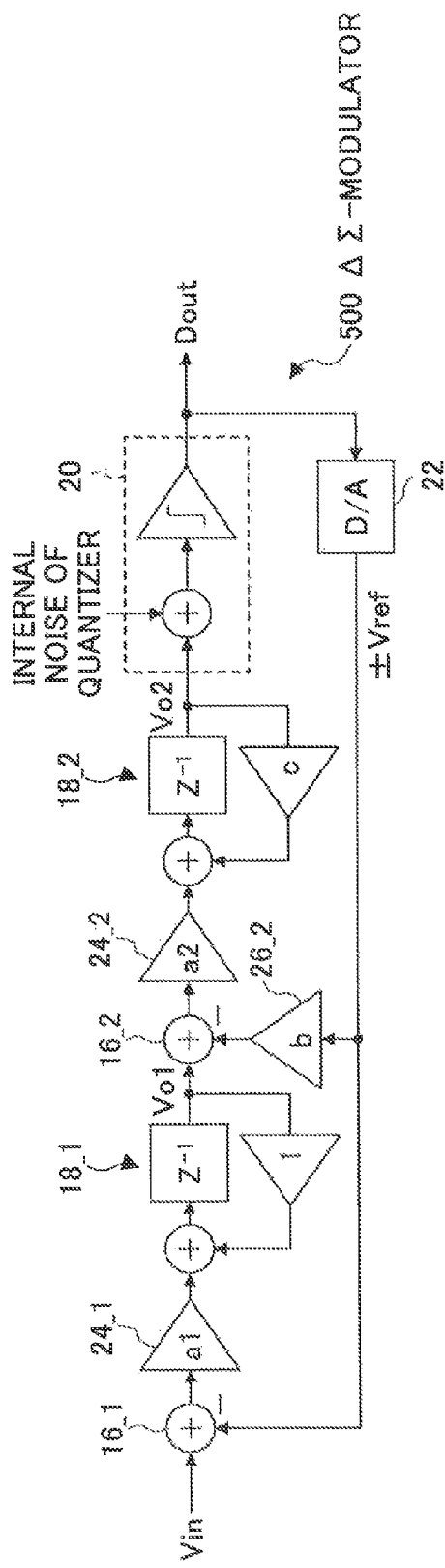
FIG. 12 is a block diagram of a ΔΣ-modulator according to a third embodiment of the present invention.

FIG. 12 is a block diagram of a EE-modulator 500 according to a third embodiment of the present invention. Note that the ΔΣ-modulator 500 of the second-order is illustrated in FIG. 12. Also note that the same numerical codes are assigned to the same parts in FIG. 12 as in the configuration in FIG. 2, and their description is omitted or simplified. The ΔΣ-modulator 500 in the present embodiment is implemented by designing predetermined circuit constants while maintaining substantially the same configuration as that of the ΔΣ-modulator 10 or 100 in the first or second embodiment.

In the present embodiment, as shown in the formula (20), the ΔΣ-modulator 500 is designed to have circuit constants so that a value obtained by multiplying a quantization interval Vinterval of a feedback D/A converter 22 to the first integrator 18_1, by the product of the gain of the integrators 18_1-18_$n$ (a1×a2× ... ×an), is less than or equal to 32 times of the effective value Vcomp (root-mean-square (rms)) of the equivalent input thermal noise of the quantizer 20. Especially, when the quantizer 20 is a one-bit quantizer including a single comparator, and the D/A converter 22 switches the output between (+Vref) and (−Vref) depending on the output of the quantizer 20, the circuit constants are designed to satisfy the formula (21). This is because Vinterval=(+Vref)−(−Vref)= 2·Vref is satisfied for this case.

$$(a1 \times a2 \times \ldots \times an) \cdot Vinterval \leq 32 \cdot Vcomp(rms) \quad (20)$$

$$(a1 \times a2 \times \ldots \times an) \cdot (2 \cdot Vref) \leq 32 \cdot Vcomp(rms) \quad (21)$$

In the following, the reason will be described why the circuit constants are designed as above in the ΔΣ-modulator 500 in the present embodiment. Assume here that the ΔΣ-modulator 500 is a second-order ΔΣ-modulator, and the quantizer 20 is a one-bit quantizer.

A comparator circuit that constitutes a quantizer has various error difference factors such as offset or circuit element noise. When the gain of a passive integrator at the last stage is made smaller and consequently, the output signal amplitude and the quantization interval of the quantizer become proportionately smaller, then, the output signal amplitude and quantization error difference (referred to as "quantization noise" below) determined by the quantization interval reach a level that is close to the error difference of the comparator circuit of the quantizer, and the error difference has an influence on characteristics of the ΔΣ-modulator. Principal error difference factors of the comparator circuit are classified into offset and hysteresis relating to equivalent input characteristics; flicker noise as low frequency noise; and thermal noise as white noise. In the following, it will be considered how the ΔΣ-modulator is influenced by each of these classified factors.

[Offset]

In general, there are cases where a comparator made by a CMOS circuit has an offset of several dozen mV. If the quantizer is a one-bit quantizer, and if the comparator has a DC offset error difference, the output of the passive integrator at the last stage and the output of the active SC integrator at the preceding stage are just shifted in term of DC to correct the offset error difference. Therefore, the offset does not influence the input-output characteristic of the ΔΣ-modulator as long as the active SC integrator at the preceding stage has an output amplitude range that is great enough to allow the correction.

[Hysteresis]

The hysteresis of a comparator circuit can be made, in general, sufficiently smaller by using a latched comparator that resets the inside of the circuit before a comparison operation as will be described later, and the quantity is not problematic in a usual design. Therefore, the hysteresis does not influence the input-output characteristic of the ΔΣ-modulator.

[Flicker Noise]

A low frequency noise component such as flicker noise of a MOS transistor is greatly damped by the noise shape characteristic of the ΔΣ-modulator. In the ΔΣ-modulator of the second-order or greater that has an active SC integrator at the preceding stage, a signal band component is greatly damped by the noise shape characteristic. Therefore, the flicker noise does not influence the input-output characteristic of the ΔΣ-modulator.

[Thermal Noise]

Thermal noise is random noise that has a uniform frequency spectrum, and its amplitude is represented by an effective value (root-mean-square value (rms)). The effective value of the thermal noise of a CMOS latched comparator is usually several hundred μV (no greater than several mV), which is comparatively small. If the thermal noise amplitude of the comparator is sufficiently smaller when compared with the quantization noise, the thermal noise has just a little influence on the input-output characteristic of the ΔΣ-modulator. However, when the integrator gain decreases, and the quantization noise becomes smaller to reach a level where the thermal noise amplitude of the comparator cannot be relatively neglected, the thermal noise starts to have a greater influence on the input-output characteristic of the ΔΣ-modulator.

Similarly to the quantization noise, the thermal noise at the input part of the comparator circuit is damped by the ΔΣ-modulator with noise shaping. However, if the amplitude is considerably greater compared to the quantization noise, the signal-to-noise ratio SNR becomes worse. Or, if the output amplitude of the active SC integrator at the preceding stage becomes great to exceed the normal operation range of the operational amplifier, the linearity or the noise characteristic of the ΔΣ-modulator may be degraded. On the other hand, if the thermal noise amplitude of the comparator circuit is contained within a certain range, the thermal noise functions as a dither, which produces an effect to reduce the idle tone.

Note that the quantization noise of the quantizer is nearly proportionate to the quantization interval. It is possible to consider that the quantization interval at the input of the quantizer (the output of the integrator at the last stage) takes a value obtained by multiplying the quantization interval Vinterval of the feedback D/A converter to the integrator (first integrator) at the most preceding stage, by a product of every gain of the integrators (a1×a2×...×an).

In practice, to produce the effect of decreasing the idle tone by minute self thermal noise of the comparator circuit, the product of the gain of the integrators (a1×a2×...×an) needs to be set small so that the quantization noise can be lowered to the minute level. Note that if the gain a1 of the integrator at the preceding stage is lowered too low in the second-order ΔΣ-modulator, the output signal amplitude of the integrator at the preceding stage becomes smaller to reduce the signal-to-noise ratio SNR because the noise at this stage is only damped by the first-order noise shaping effect of the integrators up to the preceding stage. Therefore, to make the product of the gain of the integrators (a1×a2×...×an) smaller, the gain a2 of the integrator at the last stage needs to be set sufficiently small.

In contrast to this, the ΔΣ-modulator 500 in the present embodiment has substantially the same configuration as the ΔΣ-modulators 10 and 100 in the first and second embodiments. Namely, a sufficient noise shape characteristic and a sufficient signal-to-noise ratio SNR can be secured at the active SC integrator 18_1 at the preceding stage because an ideal integrator is realized that has virtually no integrator leak, without lowering both the integrator gain and the signal amplitude. Also, at the passive integrator 18_2 at the following stage (last stage), by making the ratio (Cf/Cs) greater as described above, both the integrator leak and the integrator gain can be sufficiently lowered.

Also, if the thermal noise is added to the comparator circuit of the quantizer 20 in the ΔΣ-modulator 500, the thermal noise is damped by noise shaping similarly to the quantization noise, and hence, the effect of reducing the idle tone can be obtained as long as the thermal noise is within a conditional range not exceeding the quantization noise.

Furthermore, if the passive integrator of the ΔΣ-modulator 500 in the present embodiment is a passive integrator configured with a full differential circuit as described in the second embodiment, the integration capacitor can be implemented with the area efficiency four times greater than a conventional one, and not only the integrator leak, but also the integrator gain can be efficiently lowered. Thus, a ΔΣ-modulator can be implemented that has the idle tone suppressed, and has a smaller chip area.

Figure 13:
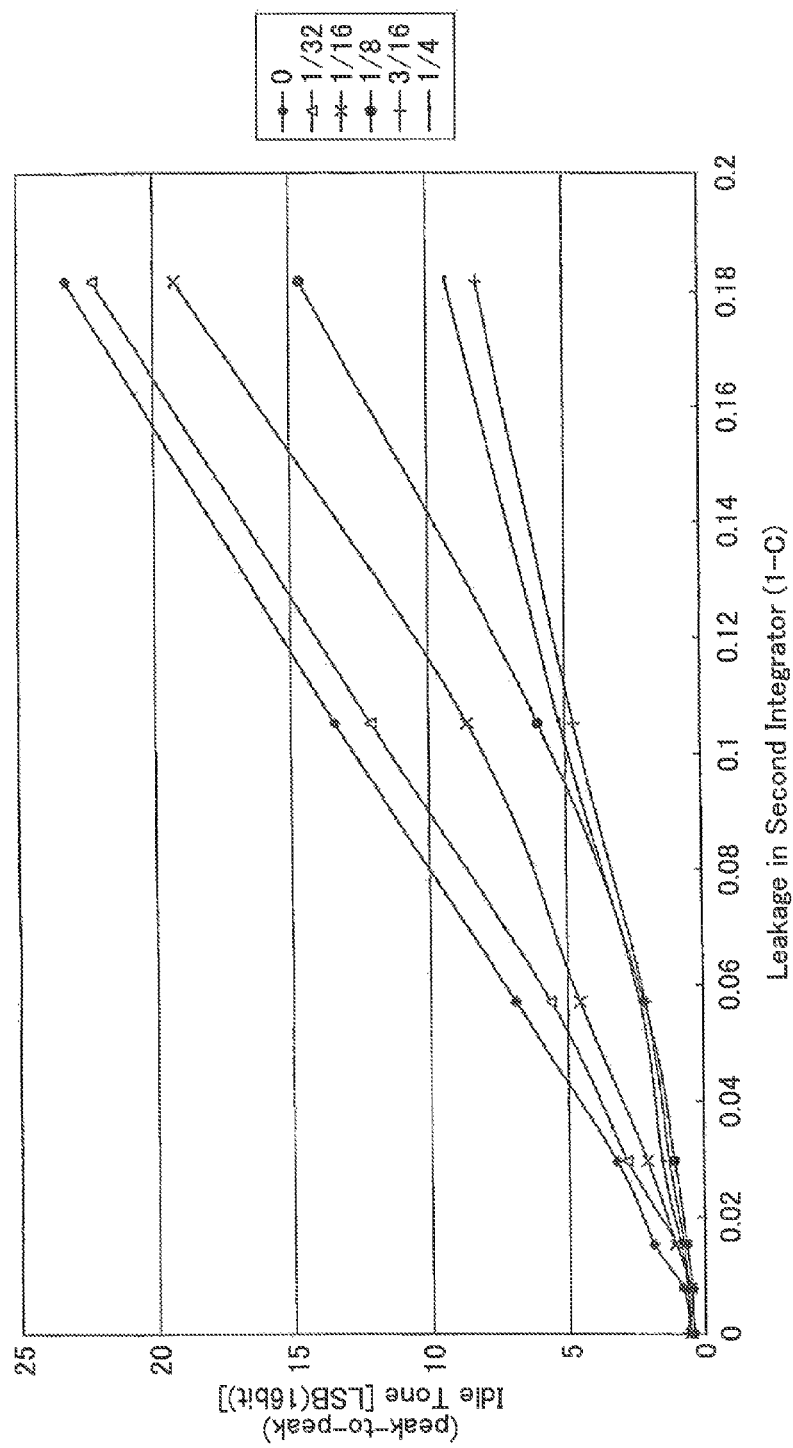
FIG. 13 is a schematic view illustrating a simulation result representing a relationship between the integrator leak (1−c) and the idle tone amplitude of a passive integrator at the last stage for each ratio of an effective value of equivalent input thermal noise over a quantization interval of the quantizer in the ΔΣ-modulator shown in FIG. 12.
Figure 14:
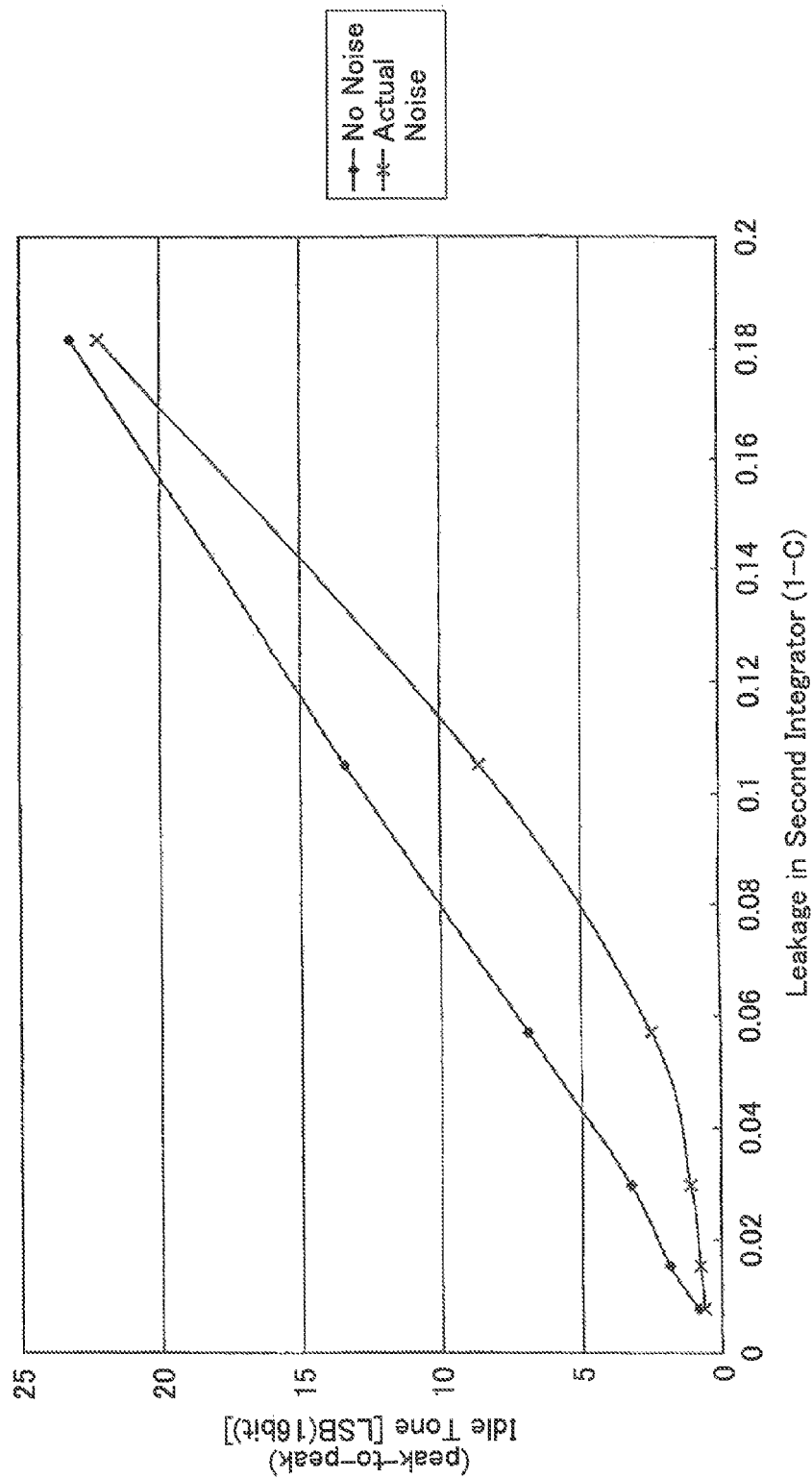
FIG. 14 is a schematic view illustrating a simulation result representing a relationship between the integrator leak (1−c) and the idle tone amplitude of a passive integrator at the last stage when the ratio of the effective value of equivalent input thermal noise over the quantization interval of the quantizer in the ΔΣ-modulator shown in FIG. 12 is fixed to 1/32, which is compared with a result without the equivalent input thermal noise.
Figure 15:
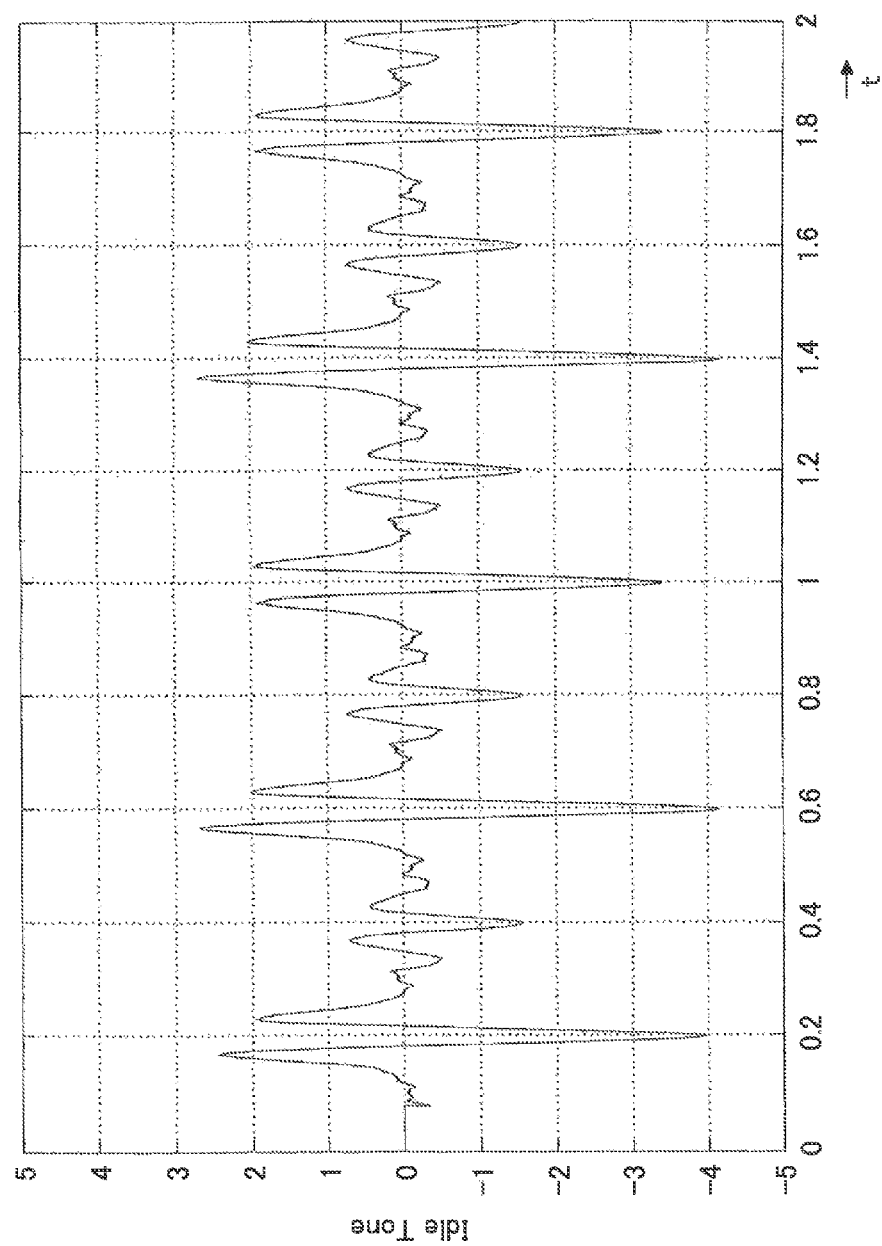
FIG. 15 illustrates a simulation result representing temporal change of an idle tone waveform when the effective value is zero for the equivalent input thermal noise of the ΔΣ-modulator shown in FIG. 12.
Figure 16:
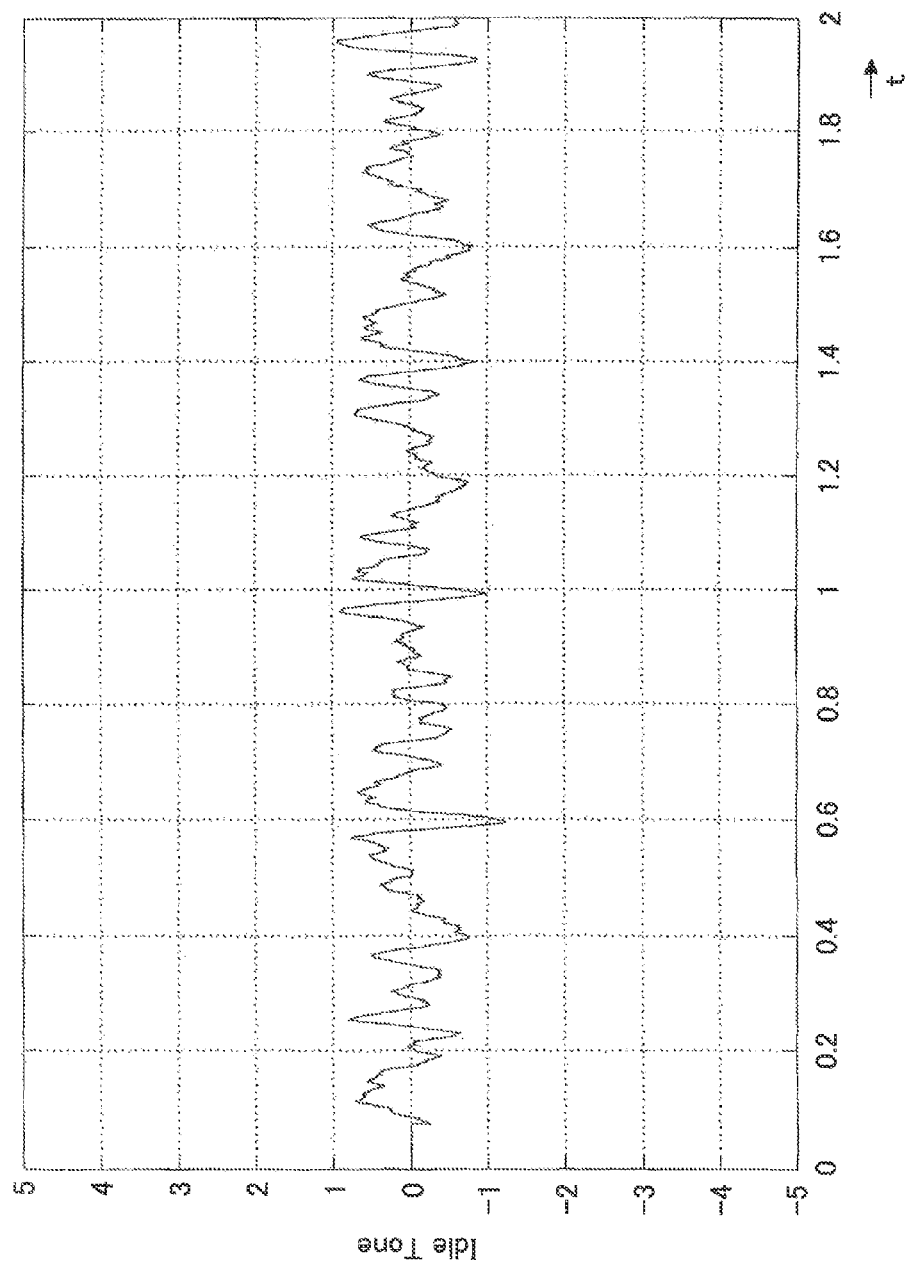
FIG. 16 illustrates a simulation result representing temporal change of an idle tone waveform when the effective value is fixed to a predetermined value for the equivalent input thermal noise of the ΔΣ-modulator shown in FIG. 12.

FIG. 13 is a schematic view illustrating a simulation result representing a relationship between the integrator leak (1−c) and the idle tone amplitude of the passive integrator 18_2 at the last stage for each ratio of the effective value of equivalent input thermal noise over the quantization interval of the quantizer 20 in the ΔΣ-modulator 500 shown in FIG. 12. FIG. 14 is a schematic view illustrating a simulation result representing a relationship between the integrator leak (1−c) and the idle tone amplitude of the passive integrator 18_2 at the last stage when the ratio of the effective value of equivalent input thermal noise over the quantization interval of the quantizer 20 in the ΔΣ-modulator 500 shown in FIG. 12 is fixed to 1/32, which is compared with a result without the equivalent input thermal noise. FIG. 15 illustrates a simulation result representing temporal change of an idle tone waveform when the effective value is zero for the equivalent input thermal noise of the ΔΣ-modulator 500 shown in FIG. 12. FIG. 16 illustrates a simulation result representing temporal change of an idle tone waveform when the effective value is fixed to a predetermined value for the equivalent input thermal noise of the ΔΣ-modulator 500 shown in FIG. 12.

The simulation result shown in FIG. 13 is obtained as follows:

the gain a1 of the active SC integrator 18_1 at the preceding stage is set to 1;

the gain a2 of the passive integrator 18_2 at the last stage is set to 1;

the gain b of the passive integrator 18_2 at the last stage from the D/A converter 22 is set to 2;

a DC value in the neighborhood of zero (for example, −0.0005·Vref to +0.0005·Vref) is applied as the analog input potential Vin;

white noise corresponding to the self thermal noise of the comparator is applied to the input of the quantizer 20 as the internal noise;

three stages of cascaded 256-sample moving average filters are used as the digital filter at the following stage of ΔΣ-modulator 500; and the effective value Vcomp(rms) of the equivalent input thermal noise of the quantizer 20 is changed for multiples of the quantization noise Vinterval (=2·Vref) including zero times (namely, not applied), 1/32 times, 1/16 times, 1/8 times, 3/16 times, and 1/4 times of Vinterval.

The simulation result shown in FIG. 13 indicates the following:

when the thermal noise is not applied to the quantizer 20, the idle tone amplitude is nearly proportional to the integrator leak (1−c) of the passive integrator 18_2 at the last stage; and when increasing the thermal noise applied to the quantizer 20, the idle tone amplitude does not change notably in a range where the effective value Vcomp (rms)≤(1/64)·Vinterval is satisfied, however, when the thermal noise goes over the range, the idle tone amplitude starts reducing, and within the range where Vcomp(rms)≥(1/32)·Vinterval is satisfied, the idle tone amplitude is greatly reduced.

Note that under the conditions, the noise amplitude (peak-to-peak) including the idle tone takes a minimum value when the effective value Vcomp(rms) of the equivalent input thermal noise of the quantizer 20 is 1/8 to 1/4 of the quantization interval Vinterval.

Also, the simulation result shown in FIG. 14 is obtained as follows:

the gain a1 of the active SC integrator 18_1 at the preceding stage is set to 1;

the gain b of the passive integrator 18_2 at the last stage from the D/A converter 22 is set to 2;

the effective value Vcomp(rms) of the equivalent input thermal noise of the quantizer 20 is fixed to 1/32 times of the quantization noise Vinterval (=2 Vref); and the gain a2 of the passive integrator 18_2 at the last stage is changed proportionate to the integrator leak (1−c) (a2=(1/2)·(1−c)).

The simulation result shown in FIG. 14 indicates the following:

when decreasing the integrator leak (1−c) of the passive integrator 18_2 at the last stage, the idle tone amplitude becomes smaller, and if the equivalent input thermal noise of the quantizer 20 is zero, the idle tone amplitude decreases proportionate to the integrator leak (1−c);

on the other hand, if the quantizer 20 has the equivalent input thermal noise, when the integrator leak (1−c) decreases, the gain a2 of the passive integrator 18_2 at the last stage also decreases proportionately, and the idle tone as a whole decreases at an accelerated rate (idle tone reducing effect by the self thermal noise of the comparator circuit).

Furthermore, the simulation results shown in FIGS. 15-16 are obtained as follows:

the analog input potential Vin of a second-order ΔΣ-modulator is set to (1/4000)·Vref;

the gain a1 of the active SC integrator 18_1 at the preceding stage is set to 1/2;

the gain a2 of the passive integrator 18_2 at the last stage is set to 1/35;

the gain b of the passive integrator 18_2 at the last stage from the D/A converter 22 is set to 1;

the integrator leak (1−c) of the passive integrator 18_2 at the last stage is set to 2/35; and three stages of cascaded 256-sample moving average filters are used as the digital filter at the following stage of ΔΣ-modulator 500.

In addition, in the simulation result shown in FIG. 15, the effective value Vcomp(rms) of the equivalent input thermal noise of the quantizer 20 is set to zero. Furthermore, in the simulation result shown in FIG. 16, the effective value Vcomp (rms) of the equivalent input thermal noise of the quantizer 20 is set to (1/8)·(a1·a2)·(2·Vref)=(1/8)·(1/70)·(2·Vref).

The simulation results shown in FIGS. 15-16 indicate the idle tone amplitude is suppressed to 1/3 lower or less when inputting the thermal noise into the quantizer 20, compared when not inputting the thermal noise.

As described above, in the present embodiment, the ΔΣ-modulator 500 is designed to have circuit constants so that a value obtained by multiplying the quantization interval Vinterval of the feedback D/A converter 22 to the first integrator 18_1, by the product of the gain of the integrators 18_1-18_$n$ (a1×a2×...×an), is less than or equal to 32 times of the effective value Vcomp (root-mean-square (rms)) of the equivalent input thermal noise of the quantizer 20 (to satisfy the formula (20). Especially, when the quantizer 20 is a one-bit quantizer including a single comparator, and the D/A converter 22 switches the output between (+Vref) and (−Vref) depending on the output of the quantizer 20, the circuit constants are designed to satisfy the formula (21).

For example, in the configuration of a second-order ΔΣ-modulator as shown in FIG. 3, the quantization interval Vinterval of the quantizer 20 (the comparator 44) to the first integrator 18_1 is Vref(=(Vref+)−(Vref−)), the gain a1 of the first integrator 18_1 is (Cs1/Cf1), and the gain a2 of the second integrator 18_2 is (Cs2/Cf2). Therefore, the circuit constants are set in the configuration so that the next formula (22) is satisfied following (a1·a2)·Vinterval≤32·Vcomp (rms).

$$(Cs1/Cf1)\cdot(Cs2/Cf2)\cdot Vrefs \le 32\cdot Vcomp(rms) \qquad (22)$$

Also, in the configuration of a second-order ΔΣ-modulator as shown in FIG. 10, it is assumed that Cs1$p$=Cs1$n$(=Cs10), Cref1$p$=Cref1$n$(=Cref10), Cf1$p$=Cf1$n$(=Cf10), Cs2$p$=Cs2$n$ (=Cs20), Cref2$p$=Cref2$n$(=Cref20), and Cfd1=Cfd2(=Cfd0) are satisfied. Also, the passive integrator 18_2 is configured with a full differential circuit, the quantizer 20 is a one-bit quantizer including a single comparator 44 in this configuration. If the D/A converter 22 switches the output between (+Vref) and (−Vref) depending on the output of the quantizer 20, the quantization interval Vinterval of the comparator 44 to the first integrator 18_1 is 2·Vref. Also, if the sampling capacitor Cref for the reference voltage is set independently from the sampling capacitor Cs, the reference voltage Vref is multiplied by (Cref/Cs) times in terms of equivalent analog input potential Vin.

$$Vinterval=2\cdot(Cref10/Cs10)\cdot Vref$$

$$a1=(Cs10/Cf10)$$

$$a2=Cs20/(Cs20+Cref20+4\cdot Cfd0)$$

Therefore, in the configuration of the second-order ΔΣ-modulator as shown in FIG. 10, the circuit constants are set so that the next formula (23) is satisfied following (a1·a2)·Vinterval≤32·Vcomp(rms). Note that Vref=(Vref+)−(Vref−) is satisfied.

$$(Cs10/Cf10)\cdot(Cs20/(Cs20+Cref20+4\cdot Cfd0))\cdot(2\cdot \\ (Cref10/Cs10)\cdot(Vref)=(Cref10/Cf10)\cdot(Cs20/ \\ (Cs20+Cref20+4\cdot Cfd0))\cdot(2\cdot Vref)\le 32\cdot Vcomp(rms) \qquad (23)$$

For example, when Cref10/Cf10=1/2, Vref=256 mV, and Vcomp(rms)=0.5 mV are satisfied, the gain a2 of the second integrator (passive integrator at the last stage) 18_2 may be set to 1/16 or lower.

Configured as such, the ΔΣ-modulator 500 can effectively reduce the idle tone. Therefore, the capacitance value of the integration capacitor of the passive integrator 18_2 at the last stage can be set smaller than a capacitance value predicted only from the integrator leak (1−c) in theory, and an extremely large-size integration capacitor does not need to be provided, which makes the chip size and the cost further reduced. Also, the configuration of the ΔΣ-modulator 500 does not need to include a special-purpose dither generation/application circuit for reducing the idle tone. Thus, a ΔΣ-modulator can be realized that efficiently suppresses the idle tone, and reduces the chip size and the cost as well.

Therefore, with a ΔΣ-A/D converter including the ΔΣ-modulator 500 in the present embodiment, A/D conversion having wide-band and high-resolution can be implemented with a smaller chip area.

Note that if the quantizer 20 is a one-bit quantizer including a single comparator 44, the comparator 44 just determines the positives or the negative and outputs the result, and hence, if the integration capacitor of the passive integrator 18_2 at the last stage has non-linearity, the linearity of the ΔΣ-modulator can be maintained. Therefore, a capacitor having a high capacitance/area efficiency such as a gate oxide film MOS capacitor or a PN junction capacitor can be used as the integration capacitor of the passive integrator 18_2 at the last stage, with which an efficient ΔΣ-modulator having a small chip area can be implemented.

Incidentally, in the first to third embodiments, although the passive integrator at the last stage in the ΔΣ-modulator is a passive SC integrator that is configured with a switched capacitor circuit including a switch and a capacitor, the present invention is not restricted to that, but it may be a passive RC integrator in which the capacitor is replaced to a resistor.

Also, in the first to third embodiments, although the second-order ΔΣ-modulator that includes integrators connected in cascade is mainly used, it is possible to apply to a third-order or greater ΔΣ-modulator that includes more than two integrators connected in cascade.

Figure 17:
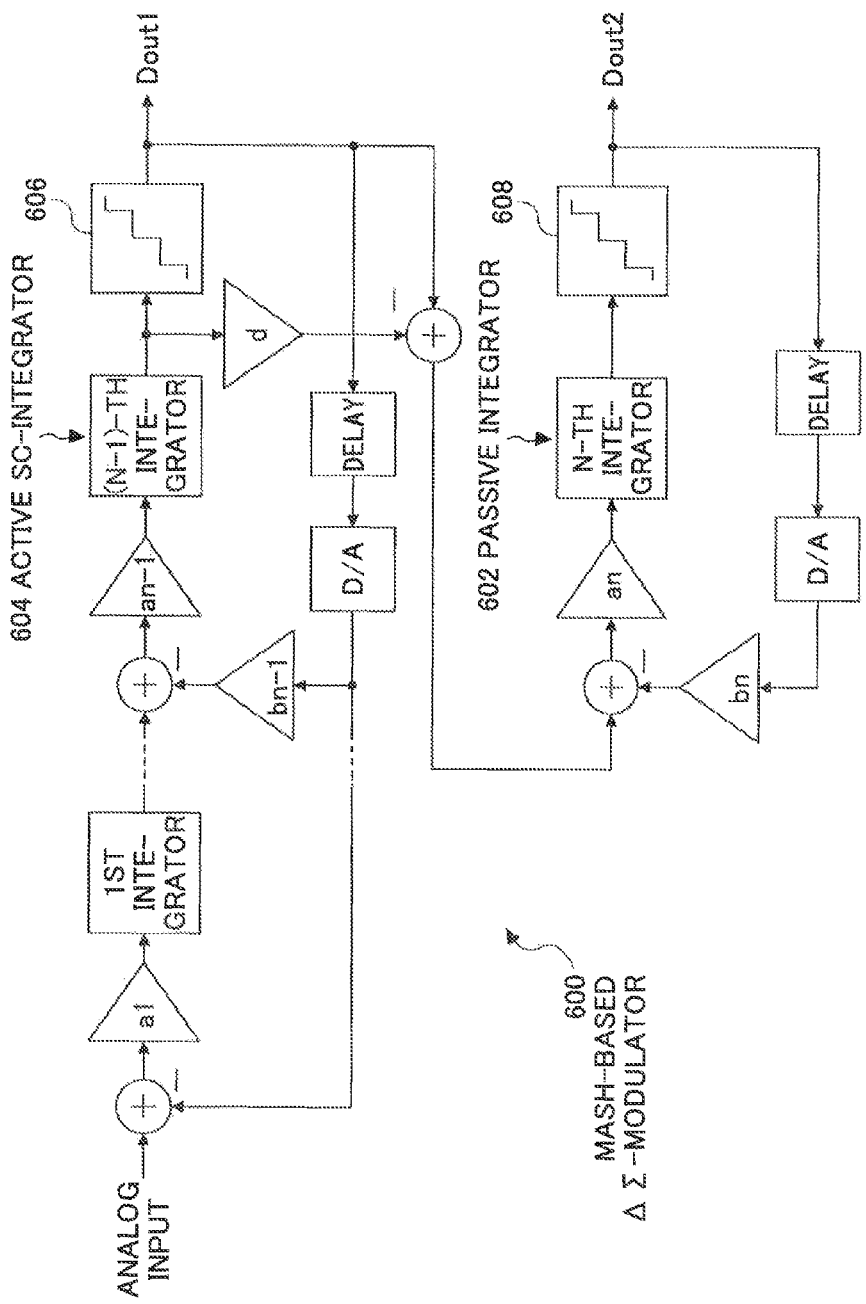
FIG. 17 is a block diagram of a ΔΣ-modulator according to a modified example of the present invention.

Also, in the first to third embodiments, the ΔΣ-modulator is assumed to include multiple integrators connected in cascade, and a unique quantizer connected with the output of the integrator (passive integrator) at the last stage. However, the present invention may be applied to a ΔΣ-modulator adopting a MASH (multi-stage noise shaping) method such as a ΔΣ-modulator 600 as shown in FIG. 17 that includes multiple n-pieces of integrators connected in cascade; a first quantizer 606 connected to the output of the (n−1)-th integrator (active SC integrator) 604 positioned at the preceding stage of the n-th integrator (passive integrator) 602 at the last stage; a second quantizer 608 connected to the output of the integrator (passive integrator) 602 positioned at the last stage, wherein both outputs of the quantizers 606 and 608 are used as the outputs Dout1 and Dout2 of the ΔΣ-modulator 600. Substantially the same effects can be obtained with such a modified example as in the above embodiments.

Furthermore, in the first to third embodiments, although the active SC integrator 18_1 using the amplifier circuit and the switched capacitor circuit is positioned at the preceding stage of the passive integrator 18_2 or 102 at the last stage, the present invention is not restricted to that, but it may be positioned at a stage that precedes two or more stages from the passive integrator 18_2 or 102 at the last stage. Namely, the active SC integrator 18_1 is allowed to be positioned at a stage preceding the passive integrator 18_2 or 102 at the last stage by one or more stages. Note that "a stage preceding the passive integrator at the last stage by one or more stages" includes the stage preceding the last stage by one, namely, the stage immediately preceding the last stage.

DESCRIPTION OF REFERENCE SYMBOLS

10, 100, 500 ΔΣ-modulator
12 ΔΣ-A/D converter
14 digital filter
16 difference signal generator
18 integrator
18_1, 300, 400 first integrator (active SC integrator)
18_2, 102, 200, 302, 304 second integrator (passive integrator)
20 quantizer
22 D/A converter
40 operational amplifier
44 comparator
Vin analog input potential
Vref reference potential
Cs sampling capacitor
Cf integration capacitor
Dout ΔΣ-modulator output
φ1 sampling phase
φ2 integration phase

The invention claimed is:

1. A ΔΣ-modulator comprising:
a plurality of integrators configured to be connected in cascade, each of the integrators is configured with a fully differential circuit having both input and output differentially configured
wherein one of the integrators positioned at a last stage is a passive integrator not using an amplifier circuit, and the passive integrator includes a pair of the sampling capacitors to sample respective differential input signals, and an integration capacitor connected between differential output terminals, and an electric charge charged in the pair of the sampling capacitors is transferred to the integration capacitor,
wherein other one or more of the integrators positioned at stages preceding the last stage by one or more stages are active SC integrators using amplifier circuits and switched capacitor circuits, respectively.

2. The ΔΣ-modulator as claimed in claim 1, wherein each of the integrators performs integral calculation by alternately repeating a first operation phase to charge a sampling element by sampling an input signal, and a second operation phase to perform summing integration by transferring an electric charge charged in the sampling element to an integration capacitor.

3. The ΔΣ-modulator as claimed in claim 2, wherein the active SC integrator performs the integral calculation during the second operation phase by connecting the sampling element with an input terminal of the amplifier circuit, and during the first operation phase, cuts off the sampling element from the input terminal of the amplifier circuit, and connects an output terminal of the amplifier circuit with the sampling element of the integrator at a next stage.

4. The ΔΣ-modulator as claimed in claim 1, wherein the integration capacitor of the passive integrator includes two capacitors connected in parallel between the differential output terminals and having the same capacitance value.

5. The ΔΣ-modulator as claimed in claim 1, wherein the passive integrator further includes a stabilizing capacitor configured to be connected between the differential output terminals of the passive integrator and common modes, respectively.

6. The ΔΣ-modulator as claimed in claim 1, further comprising:
a difference signal generator configured to generate a difference signal representing a difference between an analog input signal and a feedback signal;
an integral unit configured to include the plurality of integrators, to amplify the difference signal, and to output the amplified difference signal;

a quantizer configured to quantize the output signal from the integral unit by comparing the output signal with a predetermined threshold value; and a D/A converter configured to apply digital-analog conversion to the output signal from the quantizer to output the feedback signal.

7. The ΔΣ-modulator as claimed in claim 6, wherein the quantizer includes the quantizer for the last stage to quantize the output signal from the passive integrator, and the quantizer for a preceding stage to quantize the output signal from the active SC integrator.

8. The ΔΣ-modulator as claimed in claim 6, wherein a value obtained by multiplying a product of gain of every one of the integrators by a quantization interval of the D/A converter connected to the integrator positioned at the most preceding stage is less than or equal to 32 times of an effective value of equivalent input thermal noise of the quantizer.

9. A ΔΣ-A/D converter comprising:

the ΔΣ-modulator as claimed in claim 1; and a digital filter to apply a digital filter process to an output signal of the ΔΣ-modulator.

10. A ΔΣ-modulator comprising:

a difference signal generator configured to generate a difference signal representing a difference between an analog input signal and a feedback signal;

an integral unit configured to include a plurality of integrators, to amplify the difference signal, and to output the amplified difference signal;

a quantizer configured to quantize the output signal from the integral unit by comparing the output signal with a predetermined threshold value; and a D/A converter configured to apply digital-analog conversion to the output signal from the quantizer to output the feedback signal, wherein one of the integrators positioned at a last stage is a passive integrator not using an amplifier circuit, wherein other one or more of the integrators positioned at stages preceding the last stage by one or more stages are active SC integrators using amplifier circuits and switched capacitor circuits, respectively, wherein the quantizer starts to quantize the output signal of the passive integrator after a settling operation in the passive integrator has been completed, and before a settling operation in the active SC integrator is completed.

11. A ΔΣ-modulator comprising:

a difference signal generator configured to generate a difference signal representing a difference between an analog input signal and a feedback signal;

an integral unit configured to include a plurality of integrators, to amplify the difference signal, and to output the amplified difference signal;

a quantizer configured to quantize the output signal from the integral unit by comparing the output signal with a predetermined threshold value; and a D/A converter configured to apply digital-analog conversion to the output signal from the quantizer to output the feedback signal, wherein one of the integrators positioned at a last stage is a passive integrator not using an amplifier circuit, wherein other one or more of the integrators positioned at stages preceding the last stage by one or more stages are active SC integrators using amplifier circuits and switched capacitor circuits, respectively, wherein a value obtained by multiplying a product of gain of every one of the integrators by a quantization interval of the D/A converter connected to the integrator positioned at the most preceding stage is less than or equal to 32 times of an effective value of equivalent input thermal noise of the quantizer.

* * * * *